(12) United States Patent
Ueno et al.

(10) Patent No.: US 8,222,724 B2
(45) Date of Patent: Jul. 17, 2012

(54) SEMICONDUCTOR ELEMENT MODULE AND METHOD FOR MANUFACTURING THE SAME

(75) Inventors: Daishi Ueno, Minato-ku (JP); Taro Wada, Minato-ku (JP); Masahiro Funayama, Minato-ku (JP); Yoshikatsu Kuroda, Komaki (JP); Yuichi Kondo, Kobe (JP); Shinichi Kobayashi, Nagoya (JP); Koji Nakano, Nagoya (JP); Kenj Fujiwara, Kobe (JP); Teruo Takeshita, Minato-ku (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 72 days.

(21) Appl. No.: 12/866,322

(22) PCT Filed: Feb. 14, 2008

(86) PCT No.: PCT/JP2008/052399
§ 371 (c)(1),
(2), (4) Date: Nov. 30, 2010

(87) PCT Pub. No.: WO2009/101685
PCT Pub. Date: Aug. 20, 2009

(65) Prior Publication Data
US 2011/0062600 A1 Mar. 17, 2011

(51) Int. Cl.
*H01L 23/02* (2006.01)
(52) U.S. Cl. ............. 257/686; 57/E23.178; 57/700; 57/723; 438/109; 438/126
(58) Field of Classification Search ........... 257/E21.158, 257/E23.01, E23.011, E23.178, 684–686, 257/700, 773, 784, 723; 438/108, 109, 125–127, 438/666, 667
See application file for complete search history.

(56) References Cited

U.S. PATENT DOCUMENTS 6,706,562 B2   3/2004   Mahajan et al. .............. 438/125
(Continued)

FOREIGN PATENT DOCUMENTS

JP    6-188363    7/1994
(Continued)

OTHER PUBLICATIONS

Japanese Office Action issued Apr. 19, 2011 in corresponding Japanese Patent Application No. 2006-222541 w/English translation.

(Continued)

*Primary Examiner* — Chris Chu
(74) *Attorney, Agent, or Firm* — Wenderoth, Lind & Ponack, L.L.P.

(57) ABSTRACT

An object is to provide a semiconductor element module having high reliability, superior electric connection and thermal connection and capable of securing sufficient cooling performance, and also to provide a method for manufacturing the same. The semiconductor element module (1) comprises an IGBT (2) and a diode (3) having electrodes formed on surfaces of both sides thereof, a ceramic substrate (7), in which thermal conductivity is high, having wiring circuit layers (4, 5) formed on the surface thereof for bonding to surfaces of one side of the IGBT (2) and the diode (3), a ceramic substrate (8), in which thermal conductivity is high, having a wiring circuit layer (6) formed on the surface thereof for bonding to surfaces of other side of the IGBT (2) and the diode (3), and a sealing member (11) which is sandwiched between the outer edges of the ceramic substrates (7, 8) for sealing inside thereof; and these members are bonded by room-temperature bonding.

52 Claims, 9 Drawing Sheets

U.S. PATENT DOCUMENTS

| | | | |
|---|---|---|---|
| 6,784,530 B2 * | 8/2004 | Sugaya et al. | 257/686 |
| 7,064,440 B2 * | 6/2006 | Jobetto et al. | 257/758 |
| 7,091,593 B2 * | 8/2006 | Ishimaru et al. | 257/686 |
| 7,198,996 B2 * | 4/2007 | Nakatani et al. | 438/184 |
| 7,256,496 B2 * | 8/2007 | Okada et al. | 257/737 |
| 7,550,833 B2 * | 6/2009 | Mihara | 257/686 |
| 7,553,698 B2 * | 6/2009 | Wakabayashi et al. | 438/110 |
| 7,808,073 B2 * | 10/2010 | Wakisaka | 257/528 |
| 7,888,174 B2 * | 2/2011 | Cheng | 438/108 |
| 7,973,399 B2 * | 7/2011 | Shen | 257/684 |
| 8,004,089 B2 * | 8/2011 | Jobetto | 257/773 |
| 8,063,490 B2 * | 11/2011 | Jobetto | 257/773 |
| 8,067,274 B2 * | 11/2011 | Mihara et al. | 438/126 |
| 8,102,115 B2 * | 1/2012 | Kase et al. | 313/504 |
| 8,138,022 B2 * | 3/2012 | Sugiyama et al. | 438/109 |
| 2004/0018699 A1 | 1/2004 | Boyd et al. | 438/455 |
| 2004/0211060 A1 * | 10/2004 | Suga et al. | 29/332 |
| 2004/0245614 A1 * | 12/2004 | Jobetto | 257/678 |
| 2005/0042841 A1 | 2/2005 | Boyd et al. | 438/458 |
| 2005/0184377 A1 * | 8/2005 | Takeuchi et al. | 257/686 |
| 2005/0211465 A1 * | 9/2005 | Sunohara et al. | 174/260 |
| 2006/0231939 A1 * | 10/2006 | Kawabata et al. | 257/686 |

FOREIGN PATENT DOCUMENTS

| | | |
|---|---|---|
| JP | 10-56131 | 2/1998 |
| JP | 2003-17658 | 1/2003 |
| JP | 2004-327718 | 11/2004 |
| JP | 2005-260099 | 9/2005 |
| JP | 2006-32791 | 2/2006 |
| JP | 2006-120933 | 5/2006 |
| JP | 2006-202799 | 8/2006 |
| JP | 2007-189171 | 7/2007 |
| JP | 2008-47736 | 2/2008 |
| WO | 98/43301 | 10/1998 |

OTHER PUBLICATIONS

International Search Report issued Apr. 22, 2008 in International (PCT) Application No. PCT/JP2008/052399.

Supplementary Partial European Search Report issued Oct. 4, 2011 in corresponding European Patent Application No. 08711241.3.

* cited by examiner

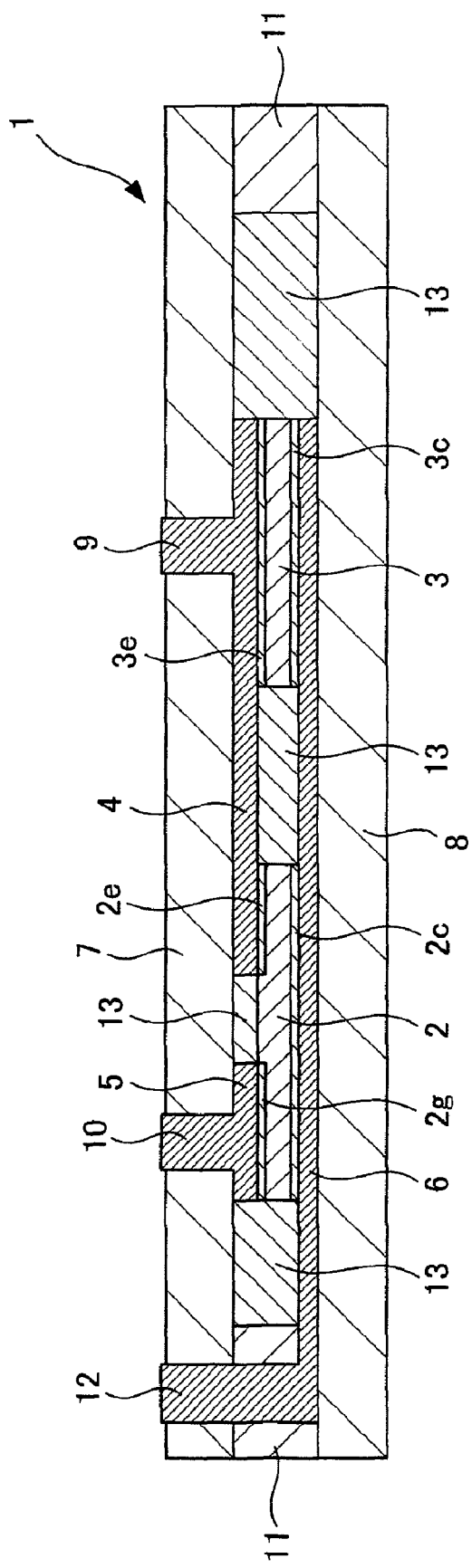

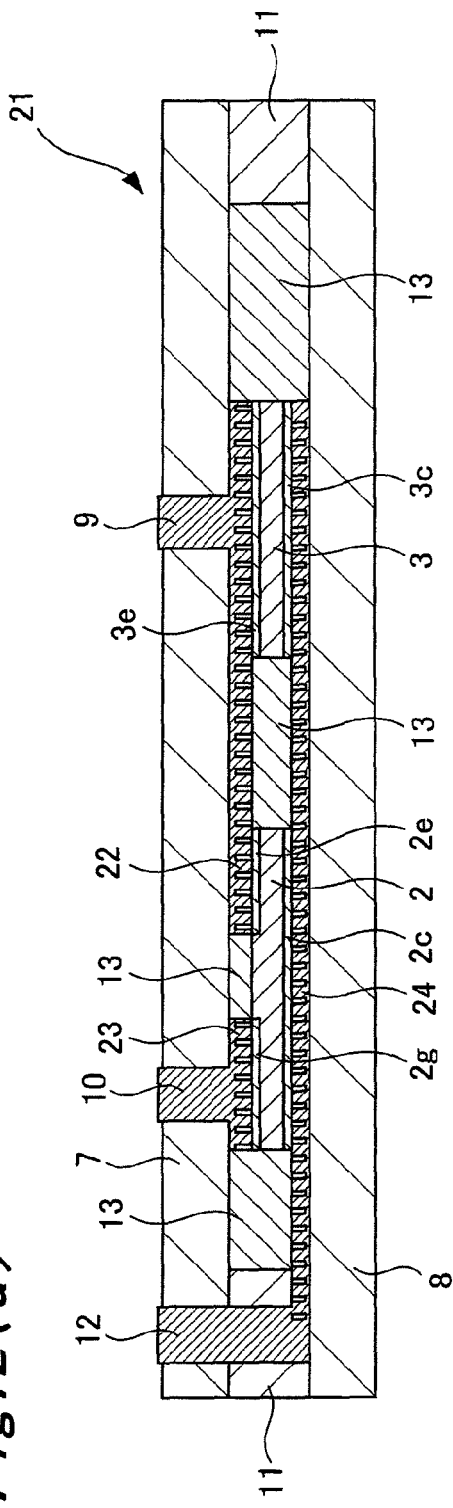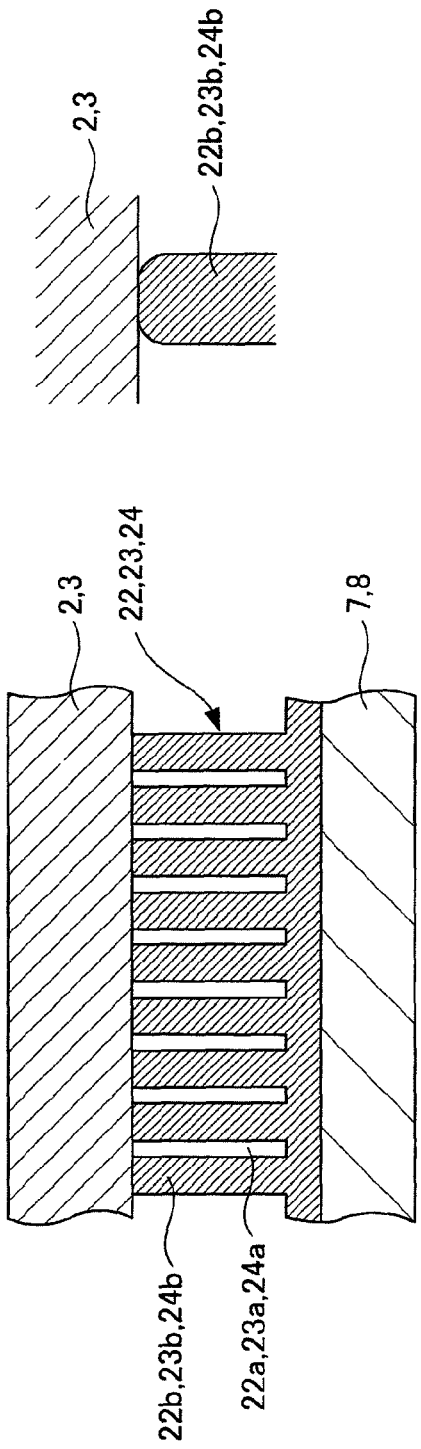

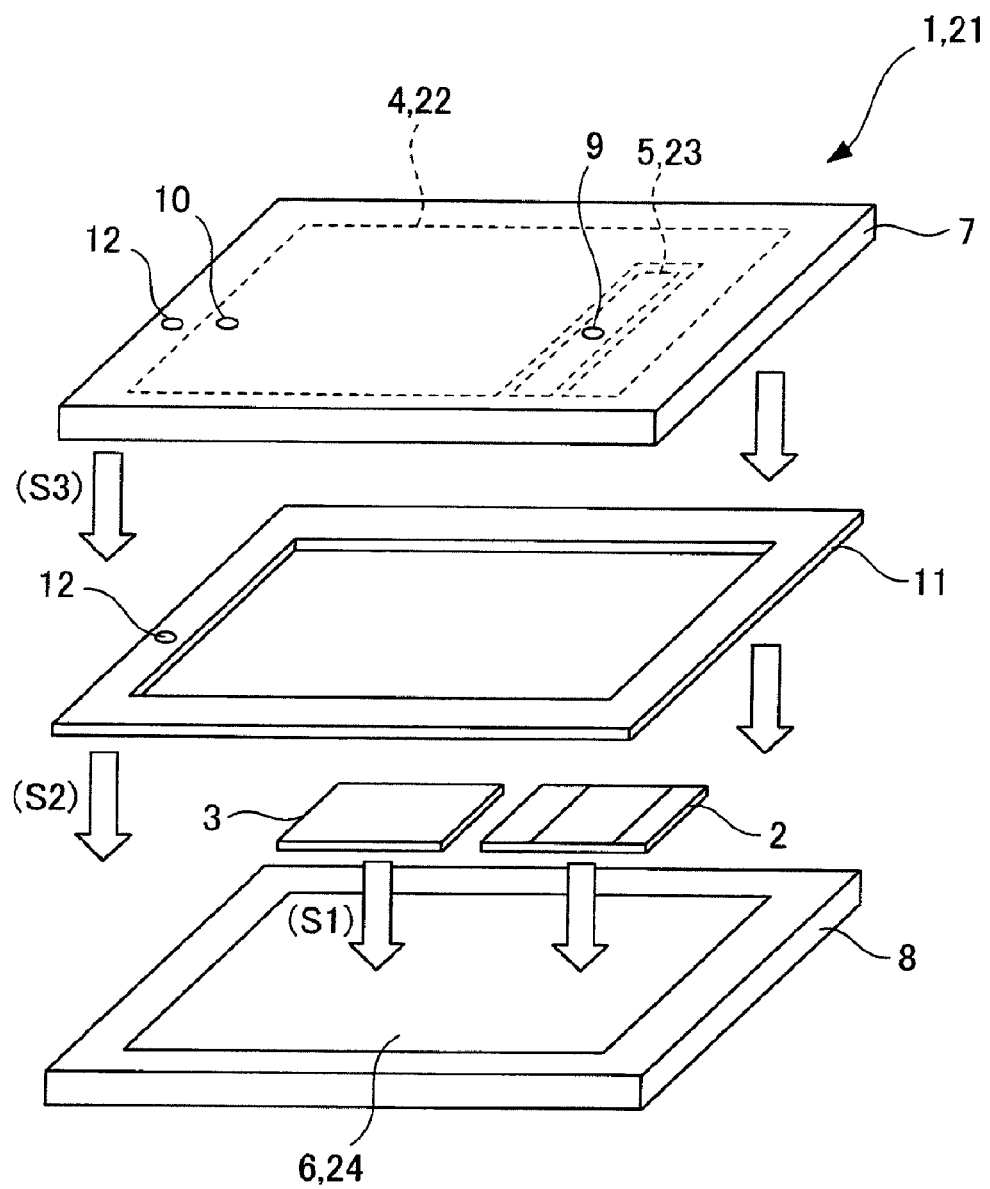

SEMICONDUCTOR ELEMENT MODULE AND METHOD FOR MANUFACTURING THE SAME

TECHNICAL FIELD

The present invention relates to a semiconductor element module and a method for manufacturing the same, and is suitable for a semiconductor element having a high output, such as a power transistor, for example.

BACKGROUND ART

Power semiconductor elements having large outputs but generating large amounts of heat, such as insulated gate bipolar transistors (hereinafter, referred to as IGBTs) need to be cooled in order to secure the reliability and longevity of their functions. In recent years, use of such power semiconductor elements has been expanding as they have been used in control of motors of electric automobiles and so forth. Hence, in addition to an improvement in output, improvements in reliability, longevity and the like are being demanded.

Patent Document 1: Japanese Patent Application Publication No. Hei 6-188363

Patent Document 2: the Pamphlet of International Patent Application Publication No. 98/43301

DISCLOSURE OF THE INVENTION

Problems to be Solved by the Invention

There is a module structure of a power semiconductor element, for example, in which the element is mounted directly or indirectly onto a substrate made of metal, which is excellent in heat radiation, and wire connections to external terminals are formed separately from each other by wire bonding (Patent Document 1). Since this structure is open on the element's upper surface side, the structure has a problem of being incapable of achieving a sufficient cooling performance. In addition, the method of forming wire connections to external terminals separately from each other by wire bonding requires complicated and difficult processes as well as a large number of processes. Hence, there is also a problem of high process cost.

Meanwhile, there also exists a module structure in which a power semiconductor element is sandwiched from the top and bottom by substrates made of a metal, which is excellent in heat radiation, permitting heat to be released from both upper and lower surfaces of the element (Patent Document 2). In this structure, however, electric connection is established not by bonding but by bringing the metal substrates into pressure contact with the element in order to relax stresses caused by heat generation. For this reason, the electric connection of the metal substrates to the element is insufficient, making it difficult to apply the module structure to high-output elements. Moreover, thermal connection of the metal substrates to the element is also insufficient (the condition of thermal conductivity between different members bonded together is defined herein as thermal connection). Accordingly, there is a problem of being incapable of achieving expected heat radiation performance.

Further, in the above-mentioned module structures, the limit of improvement of the whole module is determined by the limits of solder and wires for wiring, resin for packaging, and the like in terms of their heat resistance, heat cycle resistance and vibration resistance. Being incapable of satisfying the heat resistance, the heat cycle resistance and the vibration resistance required for electric automobiles and the like, these module structures have not been capable of securing sufficient reliability. For example, the element inside the module may be well, but the wirings may be damaged, impairing the function of the module as a whole and thus decreasing the reliability and longevity of the module.

Additionally, there has been a problem for the above-mentioned module structures and the like to achieve both heat radiation performance and reliability regarding the bonding between the substrate(s) and the element and/or between the substrate and a radiation fin. For example, use of adhesive for the bonding may result in a problem of somewhat low thermal conductivity and an increase in number of processes. Use of diffusion bonding or anodic bonding for the bonding may result in problems that the types of materials are limited for bonding targets and that since heating is involved in the bonding, certain time is required for cooling and also the heat influences (generates a thermal stress in) the module.

The present invention has been made in view of the above problems and has an object to provide a semiconductor element module having high reliability, superior electric connection and thermal connection and capable of securing sufficient cooling performance, and also to provide a method for manufacturing the module.

Means for Solving the Problems

A semiconductor element module according to the first invention for solving the problems is a semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed, wherein the semiconductor element includes a plurality of electrode surfaces formed on part of a surface of the semiconductor element on one side, the first insulating substrate includes a plurality of first wiring surfaces formed on a surface of the first insulating substrate on one side in such a way as to correspond to each electrode surfaces of the semiconductor element, and the semiconductor element is mounted to the first insulating substrate and the second insulating substrate by bonding the surface of the semiconductor element on the one side to the first insulating substrate by use of room-temperature bonding in such a way that the electrode surfaces of the semiconductor element are caused to face the first wiring surfaces, and bonding a surface of the semiconductor element on the other side to the second insulating substrate by room-temperature bonding.

A semiconductor element module according to the second invention for solving the problems is a semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed, wherein the semiconductor element includes a plurality of electrode surfaces formed on part of surfaces of the semiconductor element on both sides, the first insulating substrate includes a first wiring surface formed on a surface of the first insulating substrate on one side in such a way as to correspond to the electrode surfaces of the semiconductor element on one side, the second insulating substrate includes a second wiring surface formed on a surface of the second insulating substrate on one side in such a way as to correspond to the electrode surfaces of the semiconductor element on the other side, and the semiconductor element is mounted to the first insulating substrate and the second insulating substrate by bonding the surface of the semiconductor element on the one side to the first insulating substrate by use of room-temperature bonding in such a way that the electrode surfaces of the semiconductor element on the one side are caused to face the first wiring surface, and bonding the surface of the semiconductor element on the other side to the second insulating substrate by room-temperature bonding in such a way that the electrode surfaces of the semiconductor element on the other side are caused to face the second wiring surface.

A semiconductor element module according to the third invention for solving the problems is a semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed, wherein the semiconductor element includes a plurality of electrode surfaces formed over an entire surface of the semiconductor element on one side, the first insulating substrate includes a plurality of first wiring surfaces formed on a surface of the first insulating substrate on one side in such a way as to correspond to each electrode surfaces of the semiconductor element, and the semiconductor element is mounted to the first insulating substrate and the second insulating substrate by bonding the electrode surfaces of the semiconductor element to the first wiring surfaces by use of room-temperature bonding, and bonding a surface of the semiconductor element on the other side to the second insulating substrate by use of room-temperature bonding.

A semiconductor element module according to the fourth invention for solving the problems is a semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed, wherein the semiconductor element includes a plurality of electrode surfaces formed over entire surfaces of the semiconductor element on both side the first insulating substrate includes a first wiring surface formed on a surface of the first insulating substrate on one side in such a way as to correspond to the electrode surfaces of the semiconductor element on one side, the second insulating substrate includes a second wiring surface formed on a surface of the second insulating substrate on one side in such a way as to correspond to the electrode surfaces of the semiconductor element on the other side, and the semiconductor element is mounted to the first insulating substrate and the second insulating substrate by bonding the electrode surfaces of the semiconductor element on the one side to the first wiring surface by use of room-temperature bonding, and bonding the electrode surfaces of the semiconductor element on the other side to the second wiring surface by room-temperature bonding.

A semiconductor element module according to the fifth invention for solving the problems is the semiconductor element module according to any one of the first to fourth Inventions, wherein at least one of the first insulating substrate and the second insulating substrate includes a connection wiring which is connected to a corresponding one of the first wiring surface and the second wiring surface and which is connectable to an outside, and the connection wiring is formed to penetrate through the at least one of the first insulating substrate and the second insulating substrate in a thickness direction thereof.

A semiconductor element module according to the sixth invention for solving the problems is the semiconductor element module according to any one of the first to fourth Inventions, wherein at least one of the first insulating substrate and the second insulating substrate includes a connection wiring which is connected to a corresponding one of the first wiring surface and the second wiring surface and which is connectable to an outside, and the connection wiring is any one of: one which is formed in such a way as to be drawn out from a surface of the any one of the first insulating substrate and the second insulating substrate in a lateral direction and also to penetrate through the outer peripheral portion between the first insulating substrate and the second insulating substrate in the lateral direction; and one which is formed in a groove formed in such a way as to be drawn out from a surface of the any one of the first insulating substrate and the second insulating substrate in the lateral direction and also to penetrate through the at least one of the first insulating substrate and the second insulating substrate in the lateral direction.

A semiconductor element module according to the seventh invention for solving the problems is the semiconductor element module according to any one of the first to sixth Inventions, wherein at least one of the electrode surfaces, the first wiring surface and the second wiring surface is formed to have a planar surface.

A semiconductor element module according to the eighth invention for solving the problems is the semiconductor element module according to any one of the first to seventh Inventions, wherein at least one of the electrode surfaces, the first wiring surface and the second wiring surface is made of metal.

A semiconductor element module according to the ninth invention for solving the problems is a semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed with an sealing member, wherein the semiconductor element includes metallic and planar electrode surfaces formed on entire or substantially entire surfaces of the semiconductor element on both sides, the first insulating substrate includes a metallic and planar first wiring surface formed on a surface of the first insulating substrate on one side in such a way as to correspond to the electrode surfaces of the semiconductor element on one side, the sealing member includes a metallic first through-wiring connected to the first wiring surface and provided to penetrate through the sealing member, the second insulating substrate includes a metallic and planar second wiring surface formed on a surface of the second insulating substrate on one side in such a way as to correspond to the electrode surfaces of the semiconductor element on the other side, a metallic second through-wiring connected to the second wiring surface and provided to penetrate through the second insulating substrate, and a metallic third through-wiring connected to the first through-wiring and provided to penetrate through the second insulating substrate, and the semiconductor element is mounted to the first insulating substrate and the second insulating substrate by bonding the first insulating substrate to the sealing member by use of room-temperature bonding to thereby bond the first wiring surface to the first through-wiring, and bonding the electrode surfaces of the semiconductor element to the first wiring surface and the second wiring surface by use of room-temperature bonding.

A semiconductor element module according to the 10th invention for solving the problems is the semiconductor element module according to any one of the third to ninth Inventions, wherein a plurality of deformable and fine columnar electrodes are provided to surfaces of either the first and second wiring surfaces or the electrode surfaces of the semiconductor element, or both and at least one of the first wiring surface and the second wiring surface is bonded to the electrode surfaces of the semiconductor element with the plurality of columnar electrodes therebetween, by use of room-temperature bonding.

A semiconductor element module according to the 11th invention for solving the problems is the semiconductor element module according to the 10th Invention, wherein shoulders at edges of bonding portions of the columnar electrodes are rounded, the shoulders being located on either sides closer to the first and second wiring surfaces or sides closer to the electrode surfaces of the semiconductor element, or both.

A semiconductor element module according to the 12th invention for solving the problems is the semiconductor element module according to any one of the fifth to 11th Inventions, wherein cooling means for cooling the semiconductor element module is provided to an outer surface of at least one of the first insulating substrate and the second insulating substrate by use of room-temperature bonding, in a case where both the first insulating substrate and the second insulating substrate or either the first insulating substrate or the second insulating substrate has no wiring penetrating therethrough in the thickness direction thereof.

A method for manufacturing a semiconductor element module according to the 13th invention for solving the problems is a method for manufacturing a semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed, the method comprising: forming a plurality of electrode surfaces on part of a surface of the semiconductor element on one side, forming a plurality of first wiring surfaces on a surface of the first insulating substrate on one side in such a way that the first wiring surfaces corresponds to each electrode surfaces of the semiconductor element, and mounting the semiconductor element to the first insulating substrate and the second insulating substrate by bonding the surface of the semiconductor element on the one side to the first insulating substrate by use of room-temperature bonding in such a way that the electrode surfaces of the semiconductor element are caused to face the first wiring surfaces, and bonding a surface of the semiconductor element on the other side to the second insulating substrate by room-temperature bonding.

A method for manufacturing a semiconductor element module according to the 14th invention for solving the problems is a method for manufacturing a semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed, the method comprising: forming a plurality of electrode surfaces on part of surfaces of the semiconductor element on both sides; forming a first wiring surface on a surface of the first insulating substrate on one side in such a way that the first wiring surface corresponds to the electrode surfaces of the semiconductor element on one side; forming a second wiring surface on a surface of the second insulating substrate on one side in such a way that the second wiring surface corresponds to the electrode surfaces of the semiconductor element on the other side; and the semiconductor element is mounted to the first insulating substrate and the second insulating substrate by bonding the surface of the semiconductor element on the one side to the first insulating substrate by use of room-temperature bonding in such a way that the electrode surfaces of the semiconductor element on the one side are caused to face the first wiring surface, and bonding the surface of the semiconductor element on the other side to the second insulating substrate by room-temperature bonding in such a way that the electrode surfaces of the semiconductor element on the other side are caused to face the second wiring surface.

A method for manufacturing a semiconductor element module according to the 15th invention for solving the problems is a method for manufacturing a semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed, the method comprising: forming a plurality of electrode surfaces over an entire surface of the semiconductor element on one side; forming a plurality of first wiring surfaces on a surface of the first insulating substrate on one side in such away that the first wiring surfaces corresponds to each electrode surfaces of the semiconductor element on the one side; and mounting the semiconductor element to the first insulating substrate and the second insulating substrate by bonding the electrode surfaces of the semiconductor element to the first wiring surfaces by use of room-temperature bonding, and bonding a surface of the semiconductor element on the other side to the second insulating substrate by use of room-temperature bonding.

A method for manufacturing a semiconductor element module according to the 16th invention for solving the problems is a method for manufacturing a semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed, the method comprising: forming a plurality of electrode surfaces over entire surfaces of the semiconductor element on both sides; forming a first wiring surface on a surface of the first insulating substrate on one side in such a way that the first wiring surface corresponds to the electrode surfaces of the semiconductor element on one side; forming a second wiring surface on a surface of the second insulating substrate on one side in such a way that the second wiring surface corresponds to the electrode surfaces of the semiconductor element on the other side; and mounting the semiconductor element to the first insulating substrate and the second insulating substrate by bonding the electrode surfaces of the semiconductor element on the one side to the first wiring surface by use of room-temperature bonding, and bonding the electrode surfaces of the semiconductor element on the other side to the second wiring surface by room-temperature bonding.

A method for manufacturing a semiconductor element module according to the 17th invention for solving the problems is the semiconductor element module according to any one of the 13th to 16th Inventions, wherein a connection wiring is formed in at least one of the first insulating substrate and the second insulating substrate in such a way as to be connected to a corresponding one of the first wiring surface and the second wiring surface and to penetrate through the at least one of the first insulating substrate and the second insulating substrate in a thickness direction thereof so that the connection wiring is connectable to an outside.

A method for manufacturing a semiconductor element module according to the 18th invention for solving the problems is the semiconductor element module according to any one of the 13th to 16th Inventions, wherein a connection wiring which is connected to any one of the first wiring surface and the second wiring surface and which is connectable to an outside is formed by: forming a wiring in such a way that the wiring is drawn out from a surface of the any one of the first insulating substrate and the second insulating substrate in a lateral direction and penetrates through the outer peripheral portion between the first insulating substrate and the second insulating substrate in the lateral direction; or forming a groove and a wiring in the groove in such a way that the groove and the wiring are drawn out from a surface of the any one of the first insulating substrate and the second insulating substrate in the lateral direction and penetrates through the at least one of the first insulating substrate and the second insulating substrate in the lateral direction.

A method for manufacturing a semiconductor element module according to the 19th invention for solving the problems is the semiconductor element module according to any one of the 13th to 18th Inventions, wherein at least one of the electrode surfaces, the first wiring surface and the second wiring surface is formed to have a planar surface.

A method for manufacturing a semiconductor element module according to the 20th invention for solving the problems is the semiconductor element module according to any one of the 13th to 19th Inventions, wherein at least one of the electrode surfaces, the first wiring surface and the second wiring surface is made of metal.

A method for manufacturing a semiconductor element module according to the 21st invention for solving the problems is a method for manufacturing a semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed with a sealing member, the method comprising: forming metallic and planar electrode surfaces in entire or substantially entire surfaces of the semiconductor element on both sides; forming a metallic and planar first wiring surface on a surface of the first insulating substrate on one side in such a way that the first wiring surface corresponds to the electrode surfaces of the semiconductor element on one side; forming a metallic first through-wiring penetrating through the sealing member and connected to the first wiring surface is formed; forming a metallic and planar second wiring surface on a surface of the second insulating substrate on one side in such a way that the second wiring surface corresponds to the electrode surfaces of the semiconductor element on the other side; forming a metallic second through-wiring penetrating through the second insulating substrate and connected to the second wiring surface; forming a metallic third through-wiring penetrating through the second insulating substrate and connected to the first through-wiring; and mounting the semiconductor element to the first insulating substrate and the second insulating substrate by bonding the first insulating substrate to the sealing member by use of room-temperature bonding to thereby bond the first wiring surface to the first through-wiring, and bonding the electrode surfaces of the semiconductor element to the first wiring surface and the second wiring surface by use of room-temperature bonding.

A method for manufacturing a semiconductor element module according to the 22nd Invention for solving the problems is the semiconductor element module according to any one of the 15th to 21st Inventions, wherein a plurality of deformable and fine columnar electrodes are formed in surfaces of either the first and second wiring surfaces or the electrode surfaces of the semiconductor element, or both, and at least one of the first wiring surface and the second wiring surface is bonded to the electrode surfaces of the semiconductor element with the plurality of columnar electrodes therebetween, by use of room-temperature bonding.

A method for manufacturing a semiconductor element module according to the 23rd Invention for solving the problems is the semiconductor element module according to the 22nd Invention, wherein shoulders at edges of bonding portions of the columnar electrodes are rounded, the shoulders being located on either sides closer to the first and second wiring surfaces or sides closer to the electrode surfaces of the semiconductor element, or both.

A method for manufacturing a semiconductor element module according to the 24th Invention for solving the problems is the semiconductor element module according to anyone of the 17th to 23rd Inventions, wherein cooling means for cooling the semiconductor element module is bonded to an outer surface of at least one of the first insulating substrate and the second insulating substrate by use of room-temperature bonding, in a case where both the first insulating substrate and the second insulating substrate or either the first insulating substrate or the second insulating substrate has no wiring penetrating therethrough in the thickness direction thereof.

Effects of the Invention

According to the present invention, the electrode surfaces are formed on the surface (s) of the semiconductor element, and also the wiring surfaces are formed on the ceramic substrates having high thermal conductivity. Then, the semiconductor element is bonded to the substrates by use of room-temperature bonding. This makes it possible to achieve a semiconductor element module having a structure in which electric connection is secured and heat radiation performance is high. In addition, since the bonding is performed by room-temperature bonding, the bond strength between the bonding members becomes equivalent to those of the bulks, so that high rigidity is achieved. Also, room-temperature bonding does not require heating in manufacturing steps, so that no thermal stress is generated. Hence, the heat cycle resistance and vibration resistance are improved, making it possible to improve the durability and reliability of the semiconductor element module. Further, with this structure, a wiring process as well as a mounting process is simplified, reducing the number of components required. This allows a significant reduction in process cost for the manufacturing processes.

BRIEF DESCRIPTION OF THE DRAWINGS

FIG. 1 shows a cross-sectional diagram illustrating an exemplary embodiment (Embodiment 1) of a semiconductor element module according to the present invention.

FIG. 2 shows cross-sectional diagrams illustrating another exemplary embodiment (Embodiment 2) of the semiconductor element module according to the present invention.

FIG. 5 shows a diagram for explaining the outline of a method for manufacturing the semiconductor element modules shown in Embodiments 1 and 2.

EXPLANATION OF REFERENCE NUMERALS

Figure 3A:
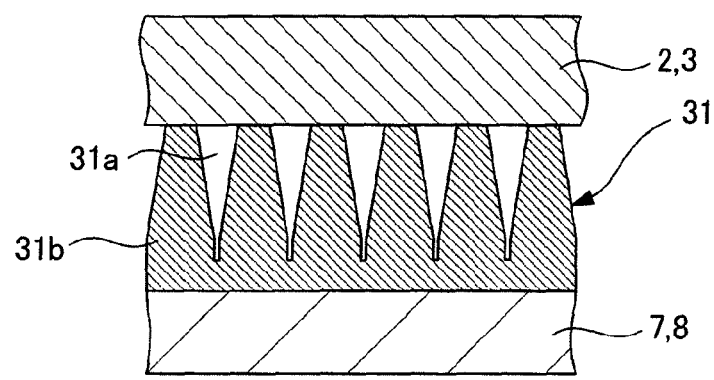
FIG. 3 shows cross-sectional diagrams illustrating modifications of the semiconductor element module illustrated in Embodiment 2.

1, 21 semiconductor element module
2 IGBT (semiconductor element)
2c, 2e, 2g electrode surface
3 diode (semiconductor element)
3c, 3e electrode surface
4, 5, 6 wiring circuit layer
7, 8 ceramic substrate
9, 10, 12 through-wiring
11 sealing member
13 resin
22, 23, 24, 31 wiring circuit layer
41 radiation fin

BEST MODES FOR CARRYING OUT THE INVENTION

Hereinbelow, a semiconductor element module according to the present invention and a method for manufacturing the same will be described by referring to FIGS. 1 to 8.
Embodiment 1

FIG. 1 shows a structure diagram illustrating an exemplary embodiment of the semiconductor element module according to the present invention.

Note that the semiconductor element module 1 of this embodiment is configured to include therein an IGBT 2 and a diode 3 as semiconductor elements, but may be configured to include at least one semiconductor element therein. The semiconductor 1 is particularly suitable for a semiconductor element which is large in amount of heat generation.

As shown in FIG. 1, the semiconductor element module 1 of this embodiment includes the IGBT 2, the diode 3, a planar plate-shaped ceramic substrate 7 (second insulating substrate), a planar plate-shaped ceramic substrate 8 (first insulating substrate) and a sealing member 11. The IGBT 2 and the diode 3 each have planar electrode surfaces formed on its both surfaces. The ceramic substrate 7 has high thermal conductivity and has planar wiring circuit layers 4 and 5 (second wiring surface) formed on its surface on one side. The wiring circuit layers 4 and 5 are to be bonded to the electrode surfaces of the IGBT2 and the diode 3 on one side. The ceramic substrate 8 has high thermal conductivity and has a planar wiring circuit layer 6 (first wiring surface) formed on its surface on one side. The wiring circuit layer 6 is bonded to the electrode surfaces of the IGBT 2 and the diode 3 on the other side. The sealing member 11 is sandwiched by outer edge portions of the ceramic substrates 7 and 8 to thereby seal the inside. The semiconductor element module 1 is formed by directly bonding interfaces of these members through room-temperature bonding.

Note that the room-temperature bonding (also called surface-activated room-temperature bonding) is a bonding method utilizing a phenomenon in which strong chemical bonding is achieved even at room temperature by: performing irradiation of ion beams or the like in vacuum so that inactive surface layers poor in reaction activity, such as oxides and impurities in the material surfaces, can be removed, i.e., allowing atomic planes, which are clean and rich in reaction activity, to be exposed from the material surfaces; and then by pressure-welding the atomic planes of the material surfaces together. By this room-temperature bonding, it is possible to achieve bond strength equivalent to those of the bulks of the materials, without having to use any adhesive. Performing the bonding at room temperature also brings about an advantage that no thermal stress remains in the materials bonded together. Note that in the case of a direct bonding technique such as anodic bonding or diffusion bonding, it is difficult to achieve reliable bond strength because bonding to an insulating material or between metals is difficult.

Now, each component will be described below further in detail.

The IGBT 2 is one obtained by forming in advance at least one transistor structure on a semiconductor substrate. The IGBT 2 is formed further by forming a collector electrode surface 2c, which is to serve as an electrode of the transistor, on the entire surface of the IGBT 2 on one side, and also by forming an emitter electrode surface 2e and a gate electrode surface 2g, which are to serve as electrodes of the transistor, on a surface of the IGBT 2 on the other side in such a manner that the total area thereof reaches desirably substantially that of the entire surface on the other side. Likewise, the diode 3 is one obtained by forming in advance at least one diode structure on a semiconductor substrate. The diode 3 is formed further by forming an electrode surface 3c, which is to serve as an electrode of the diode, on the entire surface of the diode 3 on one side, and also by forming an electrode surface 3e, which is to serve as an electrode of the diode, on the entire surface on the other side.

Surfaces of the collector electrode surface 2c, the emitter electrode surface 2e and the gate electrode surface 2g disposed on the surfaces of the IGBT 2, as well as the surfaces of the electrode surface 3c and the electrode surface 3e disposed on the surfaces of the diode 3 are polished and planarized for the bonding to the ceramic substrates 7 and 8 using room-temperature bonding.

On an inner surface of the ceramic substrate 7, there are formed the wiring circuit layers 4 and 5 having patterns corresponding to the emitter electrode surface 2e and the gate electrode surface 2g of the IGBT 2 and the electrode surface 3e of the diode 3 in locations corresponding to the emitter electrode surface 2e, the gate electrode surface 2g and the electrode surface 3e. The wiring circuit layers 4 and 5 are connected respectively to through-wirings 9 and 10 (second through-wiring) provided to penetrate through the ceramic substrate 7 in the thickness direction thereof. These through-wirings 9 and 10 serve as electrode terminals to external wirings. Meanwhile, on an inner surface of the ceramic substrate 8, there is formed the wiring circuit layer 6 having a pattern corresponding to the collector electrode surface 2c of the IGBT 2 and the electrode surface 3c of the diode 3 in a location corresponding to the collector electrode surface 2c and the electrode surface 3c. The wiring circuit layer 6 is connected to a through-wiring 12 (first and third through-electrodes) provided to penetrate through the sealing member 11 and the ceramic substrate 7 in their thickness direction. This through-wiring 12 serves an electrode terminal to an external wiring.

Surfaces of the wiring circuit layers 4, 5 and 6 disposed on the inner surfaces of the ceramic substrates 7 and 8 are also polished and planarized for the bonding to the IGBT 2 and the diode 3 using room-temperature bonding. Meanwhile, each of the wiring circuit layers 4, 5 and 6 is formed to have a thickness of 10 to 100 μm and has an electrical function as a wiring as well as a heat radiation function as a heat transfer member. Specifically, heat generated by the IGBT 2 and the diode 3 is transferred to the ceramic substrates 7 and 8 having high thermal conductivity through the wiring circuit layers 4, 5 and 6 made of metal, which is excellent in thermal conductivity, and then released to the outside.

Thus, although poly-Si or the like may be used for the wiring circuit layers 4, 5 and 6 and the through-electrodes 9, 10 and 12, for the above reason, a metal, particularly, copper or the like having low electric resistance and excellent thermal conductivity is desirable. Also, for the ceramic substrates 7 and 8, suitable is an insulating material which is high in thermal conductivity and similar in thermal expansion coefficient to such semiconductor material as silicon (Si) used for the substrates of the semiconductor elements. For example, aluminum nitride (AlN) or the like is preferable. For example, the thermal expansion coefficient of AlN (approximately $5 \times 10^{-6}$/K) is similar to the thermal expansion coefficient of Si ($3.5 \times 10^{-6}$/K), and therefore the problem of thermal stress can be alleviated even in a case of high-temperature operation of the semiconductor element module.

Meanwhile, the through-electrodes 9, 10 and 12 are provided to penetrate through the ceramic substrates 7 and 8 and the sealing member 11 and connected to the respective wiring circuit layers 4, 5 and 6. Hence, the wiring distance can be shortened. This makes it possible to reduce the inductance in the module and thus to reduce the number of capacitors of a control circuit of the semiconductor elements.

The collector electrode surface 2c, the emitter electrode surface 2e and the gate electrode surface 2g of the IGBT 2 and the electrode surface 3c and the electrode surface 3e disposed on the surfaces of the diode 3 are directly bonded to the wiring circuit layers 4, 5 and 6 corresponding to these electrode surfaces by using room-temperature bonding. Consequently, the IGBT 2 and the diode 3 are mounted to and mechanically, electrically and thermally connected to the ceramic substrates 7 and 8.

Meanwhile, the through-wirings 9, 10 and 12 are all provided to the ceramic substrate 7 as external electrode terminals as shown in FIG. 1, meaning that all the external electrode terminals are disposed in the surface on a single side. Thus, connection to the external wirings can be made easier. In this case, cooling means such as a cooling fin can be bonded to the ceramic substrate 8 in which the through-wirings 9, 10 and 12 are not present, as described in later-described Embodiment 3. This facilitates application to a structure for improving the cooling performance of the whole module. Incidentally, if such matter is not required to be taken into consideration, the through-wiring 12 may be provided to penetrate through the ceramic substrate 8 and connected to the wiring circuit layer 6.

In addition, the sealing member 11 is bonded to outer edge portions of the ceramic substrates 7 and 8 and has a function of sealing the inside of the module. The sealing member 11 is bonded to the ceramic substrates 7 and 8 by room-temperature bonding. When the bonding is performed in such a manner that the IGBT 2 and the diode 3 are sandwiched between the ceramic substrates 7 and 8, voids (portions indicated by reference numerals 13) created between the IGBT 2 and the diode 3 and between each of the IGBT 2 and the diode 3 and the sealing member 11 are made vacuum or sealed with an inert gas such as argon (Ar) therein. Otherwise, the voids are filled with a filler 13 of a resin such as silicone grease, or the like to hold the IGBT 2 and the diode 3. Filling the filler 13 is desirable from the viewpoint of cooling performance (heat radiation performance).

As described above, the semiconductor element module 1 of this embodiment is obtained by bonding, by room-temperature bonding, the electrode surfaces formed on both substantially entire surfaces of the IGBT 2 and the diode 3, to the ceramic substrates 7 and 8 having high thermal conductivity with the wiring circuit layers 4, 5 and 6 having high thermal conductivity interposed therebetween. Thereby, the IGBT 2 and the diode 3 are mounted in such a planar manner as to be sandwich by the ceramic substrates 7 and 8.

Accordingly, no additional intermediate layers need to be provided between the bonding surfaces. Also, since covalent bond makes the bonding strong, the bonding interfaces can be made low in heat resistance. Thereby, the thermal conductivity between the members improves, making it possible to achieve high heat radiation. Large portions of the surfaces of the IGBT 2 and the diode 3 are in tight contact with the conductive ceramic substrates 7 and 8 having high thermal conductivity with the conductive wiring circuit layers 4, 5 and 6 having high thermal conductivity interposed therebetween. Hence, obtained is a double-side cooling module structure in which the large portions of both surfaces of the IGBT 2 and the diode 3 are utilized as surfaces through which heat is transferred. This makes it possible to achieve further higher heat radiation.

Also, the electrode surfaces of the IGBT 2 and the diode 3 are directly bonded to the wiring circuit layers 4, 5 and 6 of the ceramic substrates 7 and 8 by room-temperature bonding without using any solder or wire. Hence, the bond strength therebetween can be made as high as those of the bulks of the materials, making it possible to significantly improve the vibration resistance of the portions where the IGBT2 and the diode 3 are mounted (wiring portions). Moreover, the wirings can withstand a high temperature, and the heat resistance can be therefore improved. Furthermore, the number of processes can be reduced, and a reduction in process cost can therefore be achieved.

As a result, a higher operation temperature of the semiconductor element as well as a uniform in-plane temperature can be achieved. In particular, it is possible to improve the durability and reliability of the wiring portions against high temperature thermal cycling. In addition, since heating is not required in the bonding, no thermal strain is caused and thus no thermal stress is generated. Accordingly, the reliability of the semiconductor element module itself can also be improved.

Note that the ceramic substrates 7 and 8 have small thicknesses, and the IGBT 2 and the diode 3 are mounted between the ceramic substrates 7 and 8 in a planar manner. Hence, when a module is formed, the thickness thereof can be reduced greatly, making the module itself compact. For example, assuming the thickness of each ceramic substrate is 2 mm and the thickness of each semiconductor element is 1 mm, the thickness of the whole module is approximately 5 mm (=2×2 mm+1 mm), indicating that the thickness can be reduced down to approximately one-tenth of those of conventional modules.

Note that although the configuration in this embodiment is such that each semiconductor element has electrode surfaces on both surfaces thereof, elements each having electrode surfaces only in a surface thereof on one side may be used instead. In this case, wiring surfaces corresponding to the electrode surfaces of the semiconductor elements as well as through-wirings as electrode terminals to the outside maybe formed on one of the ceramic substrates. The other ceramic substrate and the semiconductor elements may be bonded together by room-temperature bonding with no wiring layer formed in that ceramic substrate.

Moreover, although the bonding is performed after the electrode surfaces are polished and planarized in this embodiment, they need not to be planar. For example, it is possible to employ a method in which when a planarized ceramic substrate is to be bonded to a semiconductor element by room-temperature bonding, an electrode portion projecting slightly from the bonding surface is squashed so that conduction can be secured.

Furthermore, the configuration in this embodiment is such that the electrode surfaces are formed on the entire or substantially entire surfaces of the semiconductor elements. However, instead of using the entire surfaces for the electrodes, the configuration may be such that part of the surface is used for the electrodes, or multiple electrodes are formed on part of or the entire surface (see FIGS. 9(b) and 9(c) to be described later). An example of such is one in which multiple gate electrodes and emitter electrodes are formed on a surface on one side, and multiple collector electrodes are formed on a surface on the other side, or an electrode surface as a common collector electrode is formed on the entire or substantially entire surface on the other side. Even in this case, the semiconductor elements are directly bonded to the ceramic substrates by room-temperature bonding, in portions other than where the electrodes are. Therefore, strong bonding and high heat radiation can be achieved. Also, in the above case, the configuration may be such that wiring surfaces corresponding to the patterns of the electrodes of the semiconductor elements are formed on the ceramic substrates, or that only through-electrodes are formed at positions corresponding to the electrodes. Moreover, it is possible to employ a method in which conduction is established by squashing, by pressure welding, electrode surfaces and wiring surfaces formed of materials softer than the semiconductor elements and their insulating substrates.

Also, the configuration in this embodiment is such that the through-wirings 9, 10 and 12 as external electrode terminals are provided in a penetrating manner in the thickness direction of the ceramic substrates 7 and 8. However, the following wirings may be formed instead of these through-wirings. Specifically, as connection wirings which are connected to the wiring circuit layers 4, 5 and 6 and serve as external electrode terminals, wirings may be formed in such a way as to be drawn out from a surface of at least one of the ceramic substrates 7 and 8 in a lateral direction and penetrates through the sealing member 11 in a lateral direction which is to serve as an outer peripheral portion between the ceramic substrates 7 and 8. Alternatively, grooves may be formed in such a way as to be drawn out from a surface of at least one of the ceramic substrates 7 and 8 in a lateral direction, and wirings may be formed in the grooves in such a way as to penetrate through the at least one of the ceramic substrates 7 and 8 in a lateral direction.

Embodiment 2

FIG. 2 shows structure diagrams illustrating another exemplary embodiment of the semiconductor element module according to the present invention. Note that the same reference numerals are given to the same components as those in the semiconductor element module illustrated in Embodiment 1 (FIG. 1), and the duplicated description will be omitted.

As shown in FIG. 2(a), a semiconductor element module 21 of this embodiment has substantially the same configuration as that in Embodiment 1, but differs in wiring circuit layers 22, 23 and 24 of the ceramic substrates 7 and 8 formed correspondingly to the collector electrode surface 2c, the emitter electrode surface 2e and the gate electrode surface 2g disposed on the surfaces of the IGBT 2 and the electrode surface 3c and the electrode surface 3e disposed on the surfaces of the diode 3.

Like the wiring circuit layers 4 and 5 in Embodiment 1, on an inner surface of the ceramic substrate 7, there are formed the wiring circuit layers 22 and 23 (second wiring surface) having patterns corresponding to the emitter electrode surface 2e and the gate electrode surface 2g of the IGBT 2 and the electrode surface 3e of the diode 3 in locations corresponding to the emitter electrode surface 2e, the gate electrode surface 2g and the electrode surface 3e. Further, the wiring circuit layers 22 and 23 are connected respectively to the through-wirings 9 and 10 provided to penetrate through the ceramic substrate 7. Like the wiring circuit layer 6 in Embodiment 1, on an inner surface of the ceramic substrate 8, there is formed the wiring circuit layer 24 (first wiring surface) having a pattern corresponding to the collector electrode surface 2c of the IGBT 2 and the electrode surface 3c of the diode 3 in a location corresponding to the collector electrode surface 2c and the electrode surface 3c. Further, the wiring circuit layer 24 is connected to the sealing member 11 and the through-wiring 12 provided to penetrate through the ceramic substrate 7.

The configuration in this embodiment is, however, such that multiple high-aspect-ratio groove portions 22a (23a, 24a) are formed vertically in each planar wiring circuit layer as shown in FIG. 2(b) in order to relax the stresses at the bonding interfaces attributable to the differences between the expansion coefficients of the IGBT 2 and the diode 3 and those of the ceramic substrates 7 and 8. In this way, multiple fine columnar electrodes 22b (23b, 24b), which are rectangular, polygonal or circular, are formed at the surface side of the wiring circuit layer 22 (23, 24). Bonding surfaces of the columnar electrodes 22b (23b, 24b) are each in a rectangular, polygonal or circular dot shape, and are bonded to the electrode surfaces of the IGBT 2 and the diode 3 (illustration of the electrode surfaces of the IGBT 2 and the diode 3 are omitted). The leading end of each columnar electrode 22b (23b, 24b) is planar and has a predetermined cross-sectional area while the length thereof is set at a predetermined length. Thus, provided is a structure which enables the columnar electrodes 22b (23b, 24b) to secure electric connection and thermal connection in the longitudinal direction thereof and also to be deformed elastically in the orthogonal direction (horizontal direction in FIG. 2(b)) to the longitudinal direction. The structure thus causes the columnar electrodes 22b (23b, 24b) to function as a wiring for the IGBT 2 and the diode 3 and also as a heat transfer member for heat radiation. Further, the structure causes the convex portions 22b (23b, 24b) to deform elastically upon occurrence of displacement of the IGBT 2 and the diode 3 due to thermal expansion, whereby the stress thus generated is relaxed without impairing the electric connection and the thermal connection.

Incidentally, the structure of the wiring circuit layer 22 (23, 24) may be a square truncated pyramid, polygonal truncated pyramid, or truncated cone (rotated trapezoid) structure, like a wiring circuit layer 31 shown in FIG. 3(a). Specifically, the configuration is such that multiple high-aspect-ratio tapered groove portions 31a are formed in a planar wiring circuit layer, so that multiple columnar electrodes 31b each having a square truncated pyramid, polygonal truncated pyramid or truncated cone shape is formed in a surface of the wiring circuit layer 31. The bonding surfaces of the columnar electrodes 31b are each in a square, polygonal or circular shape, and are bonded to the electrode surfaces of the IGBT 2 and the diode 3 (illustration of the electrode surfaces of the IGBT 2 and the diode 3 are omitted). The leading end of each columnar electrode 31b is also planar and has a predetermined cross-sectional area while the length thereof is set at a predetermined length. Thus, provided is a structure which enables the columnar electrodes 31b to secure electric connection and thermal connection in the longitudinal direction thereof and also to be deformed elastically in the orthogonal direction (horizontal direction in FIG. 3(a)) to the longitudinal direction. The structure thus causes the columnar electrodes 31b to function as a wiring for the IGBT 2 and the diode 3 and also as a heat transfer member for heat radiation. Further, the structure causes the convex portions 31b to deform elastically upon occurrence of displacement of the IGBT 2 and the diode 3 due to thermal expansion, whereby the stress thus generated is relaxed without impairing the electric connection and the thermal connection.

Now, an elastically deformed state of the wiring circuit layer 31 having the above structure will be described.

The IGBT 2 and the diode 3 generate heat when used. By that heat generation, the substrates are thermally expanded and displaced. The displacement due to the thermal expansion is large especially when it comes to an IGBT 2 and a diode 3 whose outputs are large. In conventional module structures, the displacement cannot be addressed, so that the electric connection and thermal connection are impaired. This greatly affects the reliability and longevity of the module. For example, the maximum amount of displacement maybe calculated under the assumption that: the size of each semiconductor element is 10 mm$^2$; a temperature increase due to heat generation is 500° C.; the heat expansion coefficient of Si forming a substrate of a semiconductor element is approximately 3.5×10$^{-6}$/K; the heat expansion coefficient of Cu forming electrode surfaces and wiring circuit layers is 17×10$^{-6}$/K; and the heat expansion coefficient of AlN forming ceramic substrates is 5×10$^{-6}$/K. Then, it is expected that the displacement is approximately 7.5 µm at the Si-AlN interface and approximately 65 µm at the Si—Cu interface whereas large displacement is expected to occur at the Si—Cu interface.

In contrast, in this embodiment, even when the substrates of the IGBT 2 and the diode 3 thermally expand and the thermal expansion causes displacement thereof, the columnar electrodes 22b, 23b, and 24b or the columnar electrodes 31b are deformed elastically by use of the wiring circuit layers 22, 23 and 24 or the wiring circuit layers 31 having the above-described structure. The displacement can therefore be addressed. As a result, the reliability and longevity can be secured without impairing the electric connection and the thermal connection.

Figure 3B:
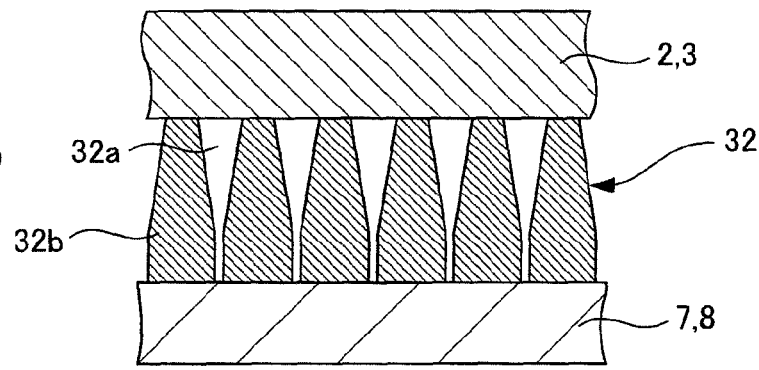
Figure 3C:
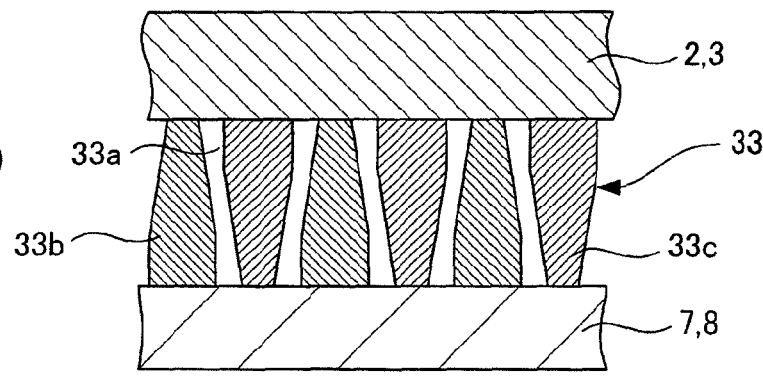

Note that the wiring circuit layers are not limited to the wiring circuit layer 31 shown in FIG. 3(a). It is possible to use a wiring circuit layer 32 which is formed of multiple pyramid/cone-shaped columnar electrodes 32b separated from one another by groove portions 32a as shown in FIG. 3(b). It is also possible to use a wiring circuit layer 33 which is formed of multiple pyramid/cone-shaped columnar electrodes 33b and 33c separated from one another by groove portions 33a, and in which the top sides of each pair of adjacent columnar electrodes 33b and 33c face mutually different directions, as shown in FIG. 3(c). In addition, the pyramid/cone-shaped columnar electrodes 32b of the wiring circuit layer 32 shown in FIG. 3(b) maybe disposed with their tops upside down. Further, the structure of the columnar electrodes may be such that the columnar electrodes 22b, 23b and 24b of the wiring circuit layers 22, 23 and 24 shown in FIG. 2(b) are separated from one another by the groove portions 22a, 23a and 24a.

In the structures of the columnar electrodes shown in FIGS. 2(b) and 3(a) to 3(c), the shoulder at the edge of the bonding portion of each of the columnar electrodes is at a right angle or a predetermined slope angle with a bonding target surface. For example, in FIG. 2(b), the shoulder at the edge of the bonding portion of each columnar electrode 22b (23b, 24b) on a side closer to the IGBT 2 or the diode 3 is substantially at a right angle with the electrode surface of the IGBT 2 or of the diode 3 where the bonding takes place. Stress relaxation is sufficient even with this configuration. However, further stress relaxation would be possible if the shoulder at the edge of the bonding portion of each columnar electrode 22b (23b, 24b) were formed into a round shape with a predetermined curvature (i.e., a shape given an R) as shown in FIG. 2(c). In this case, an R may be given to the shoulder at the edge of the bonding portion of the columnar electrode 22b (23b, 24b) on a side closer to the electrode surface of the IGBT 2 or of the diode 3, or to the shoulder at the edge of the bonding portion of the columnar electrode 22b (23b, 24b) on a side closer to the wiring surface of the corresponding one of the ceramic substrates 7 and 8.

As will be described in later-described Embodiment 4, the columnar electrodes are formed using a microfabrication technique such as etching with laser or electron beams, or imprinting through mold pressing. In formation of an R in the shoulder at the edge of the bonding portion of the columnar electrode, an R may be formed in the shoulder at the edge of the bonding portion of the columnar electrode by using the heat of laser or electron beams during or after formation of the columnar electrode. Alternatively, an R may be formed in the shoulder at the edge of the bonding portion of the columnar electrode by imprinting using a die on which the R is formed, during formation of the columnar electrode.

In addition, in this embodiment, like the portions indicated by reference numerals 13 in Embodiment 1, the groove portions 22a, 23a and 24a or the groove portions 31a maybe made vacuum or sealed with an inert gas therein, or alternatively, filled with a filler of a resin such as silicone grease, or the like in consideration with improvement in thermal conductivity.

Embodiment 3

Figure 4:
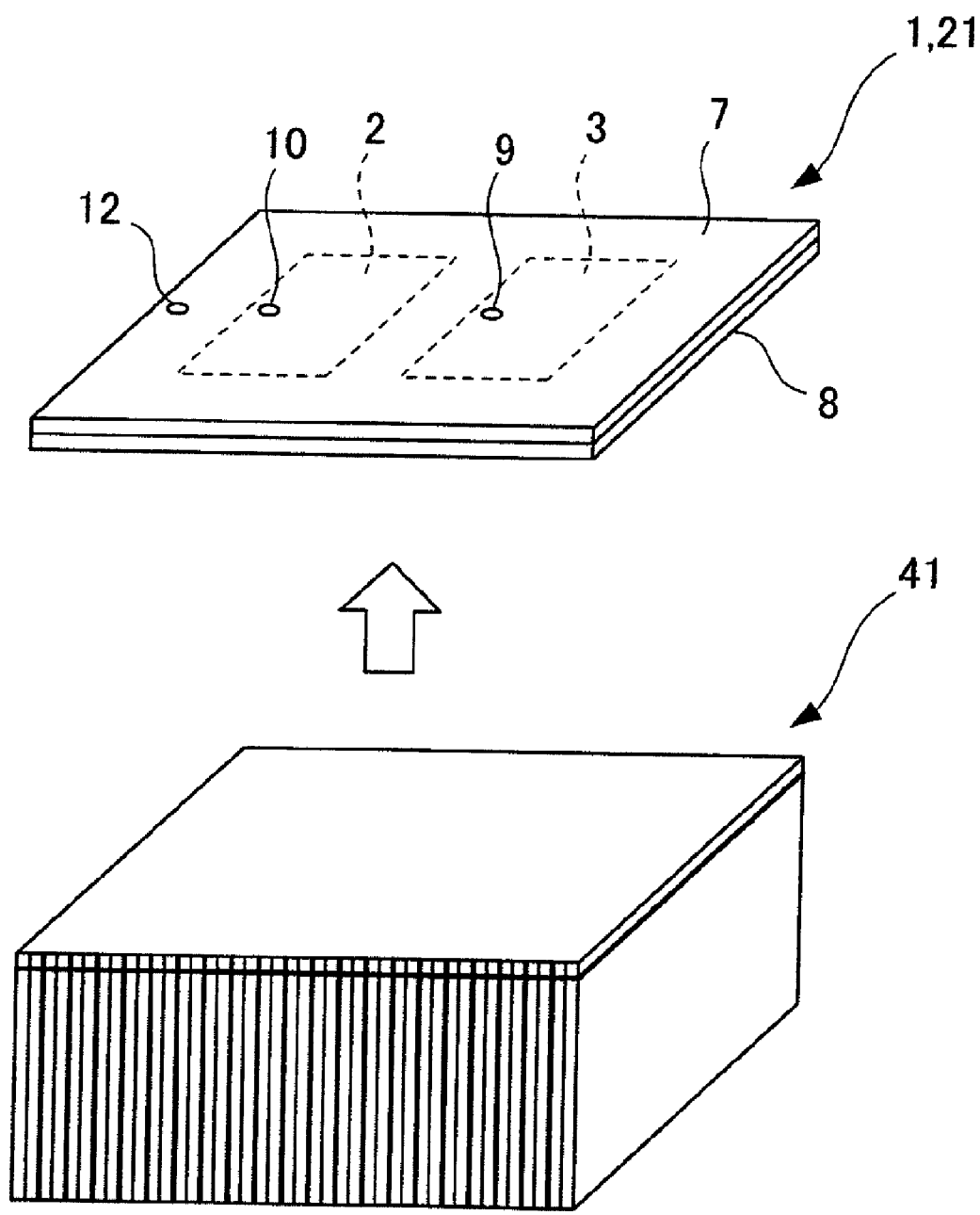
FIG. 4 shows a configuration diagram illustrating yet another exemplary embodiment (Embodiment 3) of the semiconductor element module according to the present invention.

FIG. 4 shows a structure diagram illustrating another exemplary embodiment of the semiconductor element module according to the present invention. Note that the same reference numerals are given to the same components as those in the semiconductor element modules illustrated in Embodiments 1 and 2 (FIGS. 1 and 2), and the duplicated description will be omitted.

The semiconductor element module of this embodiment is obtained by directly bonding, by room-temperature bonding, a radiation fin 41 (cooling means) made of a metal, which is excellent in heat radiation, to the ceramic substrate 8 of the semiconductor element module 1 or 21 shown in Embodiment 1 or 2 (FIG. 1 or 2).

Specifically, a bonding surface of the ceramic substrate 8 of the semiconductor element module 1 or 21 and that of the radiation fin 41 are activated by physical sputtering through ion beam irradiation or the like and then by being welded to each other with pressure at room temperature, whereby the bonding surfaces are directly bonded to each other. Incidentally, the cooling means can be a radiation fin, for example, yet may be a cooling module provided with a passage through which such coolant as water is caused to flow or the like means, for example, or alternatively a structure in which such cooling module is integrated in the substrate itself in advance by forming the passage or the like in the substrate itself.

As described in Embodiments 1 and 2, in the present invention, wirings for the IGBT 2 and the diode 3 disposed inside may be formed of the through-wirings 9, 10 and 12 provided to one of the ceramic substrates, i.e., the ceramic substrate 7. The cooling means such as the radiation fin 41 can therefore be bonded to the other ceramic substrate 8. Moreover, room-temperature bonding allows direct bonding between the ceramic substrate 8 and the radiation fin 41 without having to use an intermediate member. This leads to higher physical bond strength, which in turn leads to stronger thermal connection. Thereby, high thermal conductivity can be achieved between the ceramic substrate 8 and the radiation fin 41.

In addition, the bonding process by room-temperature bonding is performed at room temperature as mentioned previously. Thus, no influence related to heat is caused in the module, so that no thermal stress is generated. Strong bonding may also be achieved even in the bonding of different materials. Meanwhile, an intermediate member to support the bonding may be needed in some cases, depending on the type of material. However, in this case too, the physical bond strength is high and therefore the thermal connection is strong. Hence, high thermal conductivity can be achieved between the ceramic substrate 8 and the radiation fin 41.

Note that the configuration in this embodiment is such that the radiation fin 41 is provided to the outer surface of the ceramic substrate 8 having no through-wirings penetrating therethrough in the thickness direction; instead, if the through-wirings are disposed only on the ceramic substrate 8 side, the radiation fin 41 may be provided to the outer surface of the ceramic substrate 7 having no through-wirings penetrating therethrough in the thickness direction. Meanwhile, if connection wirings drawn out in a lateral direction of the ceramic substrates 7 and 8 are provided instead of the through-wirings, no through-wirings are present on the ceramic substrates 7 and 8, and thus the radiation fin 41 may be attached to the outer surface of each of the ceramic substrates 7 and 8.

Embodiment 4

Figure 7A:
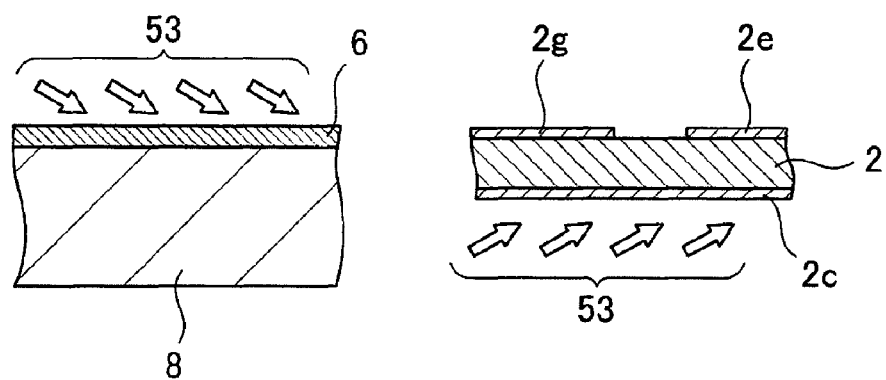
FIG. 7 shows diagrams for explaining the details of the method for manufacturing the semiconductor element modules shown in Embodiments 1 and 2.
Figure 7B:
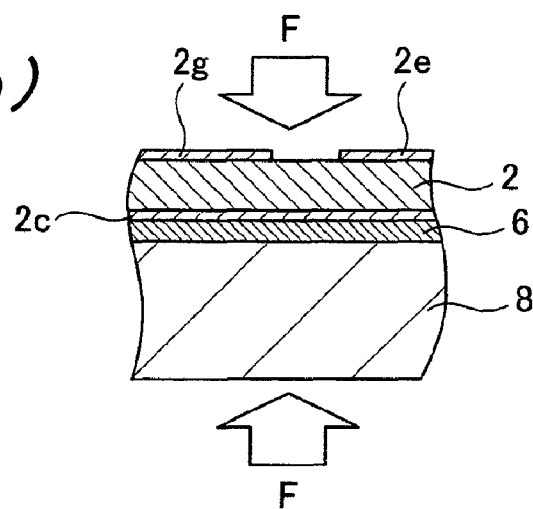
Figure 8A:
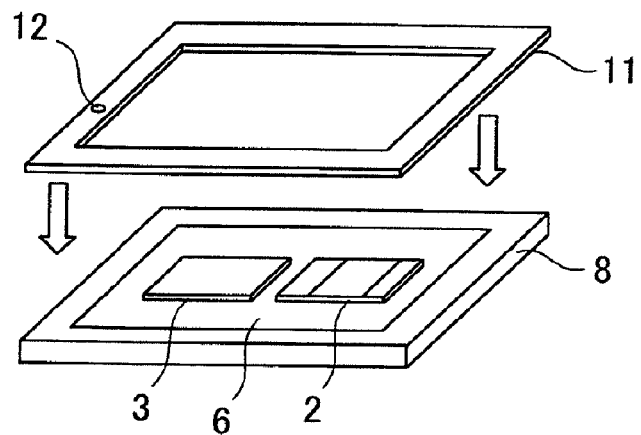
FIG. 8 shows diagrams for explaining the details of the method for manufacturing the semiconductor element modules shown in Embodiments 1 and 2.
Figure 8B:
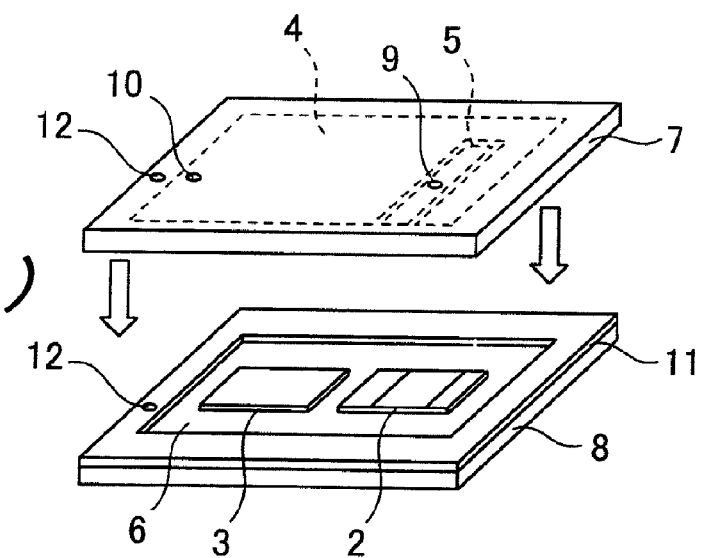

Next, a method for manufacturing the semiconductor element modules 1 and 21 illustrated in Embodiments 1 and 2 (FIGS. 1, 2, etc.) will be described using FIGS. 5 to 8. Here, FIG. 5 shows a diagram illustrating the members in an unassembled state constituting the semiconductor element module 1 or 21 illustrated in Embodiment 1 or 2, and is used for explaining the outline of the method for manufacturing the module. FIGS. 6 to 8 show diagrams for explaining details of manufacturing steps in the manufacturing method. So, each manufacturing step will be described while referring to FIG. 5. Note that the same reference numerals are given to the same components as those in the semiconductor element modules 1 and 21 illustrated in Embodiments 1 and 2.

(1) Preparation of Members

The IGBT 2, the diode 3, the ceramic substrate 7, the ceramic substrate 8 and the sealing member 11 are prepared in advance.

As to the IGBT 2 and the diode 3, at least one transistor structure and diode structure are formed on semiconductor substrates by using general semiconductor processes. On both surfaces of the semiconductor substrates, there are formed electrode surfaces (the collector electrode surface 2c, emitter electrode surface 2e, gate electrode surface 2g, electrode surface 3c and the electrode surface 3e) to be connected to the transistor structure and the diode structure. These electrode surfaces are each formed to have as large area as possible. For example, the collector electrode surface 2c and the electrode surface 3c are each formed on the entire surface of the corresponding one of the IGBT 2 and the diode 3 on one side. The electrode surface 3e is formed on the entire surface of the diode 3 on the other side. The emitter electrode surface 2e and the gate electrode surface 2g are formed on the surface of the IGBT 2 on the other side in such a way as to have as large areas as possible while securing insulation from each other. These electrode surfaces are used not only to secure electric connection but also to secure thermal connection, hence having a function of transferring heat generated by the IGBT 2 and the diode 3.

Figure 9A:
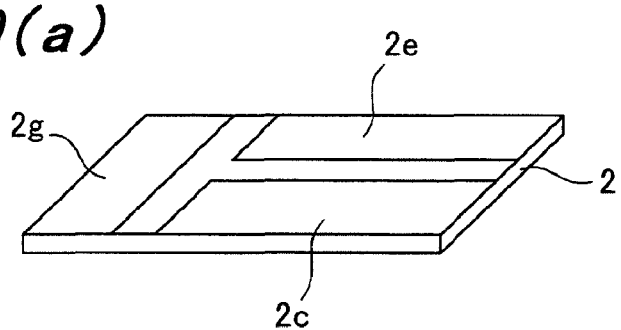
FIG. 9 shows diagrams illustrating some examples of the arrangement of electrode surfaces of each semiconductor element used in the semiconductor element module according to the present invention.
Figure 9B:
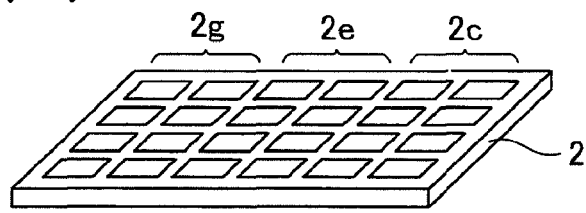
Figure 9C:
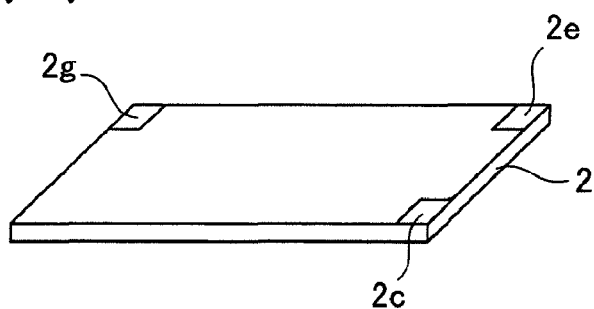
Figure 9D:
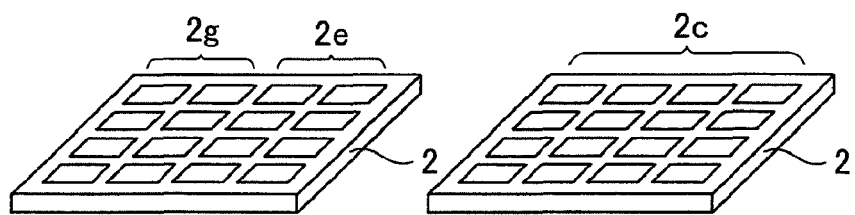

Incidentally, the configuration may be such that part of the surface is used for electrodes or many electrodes are formed on the entire or part of the surface (see FIGS. 9(b) and 9(c) to be described later). Then, on the ceramic substrate, there may be formed wiring surfaces corresponding to the patterns of the electrodes of the semiconductor element, or only through-electrodes at positions corresponding to the electrodes. Even in this case, the semiconductor element is directly bonded to the ceramic substrate by room-temperature bonding, in portions other than where the electrodes are. Therefore, strong bonding and high heat radiation can be achieved.

The ceramic substrates 7 and 8 are formed in planar plate shapes by using a general ceramics production process. Then, on the surface of each of the ceramic substrates 7 and 8 on one side (the surface located on the inner side after the module is formed), there are formed the wiring circuit layers 4, 5 and 6 (or the wiring circuit layers 22, 23 and 24) in locations corresponding to the electrode surfaces of the IGBT 2 and the diode 3. Additionally, the through-wirings 9, 10 and 12 to be connected respectively to the wiring circuit layers 4, 5 and 6 (or the wiring circuit layers 22, 23 and 24) are formed penetrating through the ceramic substrate 7. In other words, the wiring circuit layers 4, 5 and 6 (or the wiring circuit layers 22, 23 and 24) are patterned in such a way that conduction is established between the electrode surfaces of the IGBT 2 and the diode 3 and the respective through-wirings 9, 10 and 12. The sealing member 11 to seal the inside of the module is formed in a hollow flat plate shape by using a general ceramics production process. The through wiring 12 to be connected to the wiring circuit layer 6 (24) is formed also in the sealing member 11 in such a way as to penetrate through the sealing member 11 itself.

Figure 6A:
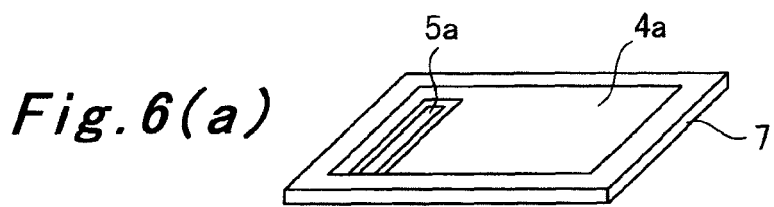
FIG. 6 shows diagrams for explaining details of the method for manufacturing the semiconductor element modules shown in Embodiments 1 and 2.

As to the wiring circuit layers 4 and 5, wiring circuit layers 4a and 5a are formed directly on the ceramic substrate 7 through a film formation process as shown in FIG. 6(a), for example. As the film formation process, a general film formation process such for example as CVD (Chemical Vapor Deposition), plating, sputtering or the like is used. More specifically, the wiring circuit layers 4a and 5a corresponding to the electrode surfaces of the IGBT 2 and the diode 3 may be formed by forming a film on the entire surface of the ceramic substrate 7 and removing part thereof and thus patterning the film by etching or the like. Alternatively, the wiring circuit layers 4a and 5a corresponding to the electrode surfaces of the IGBT 2 and the diode 3 may be patterned by forming them selectively by masking.

Figure 6B:
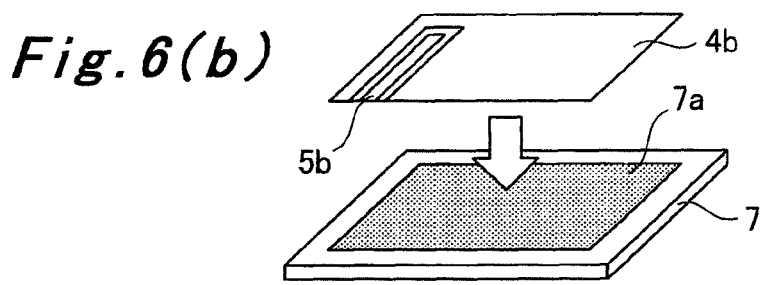

As another alternative for the wiring circuit layers 4 and 5, as shown in FIG. 6(b), wiring circuit layers 4b and 5b corresponding to the electrode surfaces of the IGBT 2 and the diode 3 may be formed by patterning a metal foil in a separate process, and then the wiring circuit layers 4b and 5b of the metal foil may be bonded to the surface of the ceramic substrate 7 by room-temperature bonding. The wiring circuit layers 4b and 5b corresponding to the electrode surfaces of the IGBT 2 and the diode 3 may be formed also by bonding a metal foil to the entire surface of the ceramic substrate 7 by room-temperature bonding and then removing part thereof and thus patterning the metal foil by etching or the like. When the metal foil is to be bonded to the ceramic substrate 7, an intermediate layer 7a may be formed between the metal foil and the ceramic substrate 7 if the bond strength therebetween is desired to be improved. Examples of the material of the intermediate layer include metals such as gold (Au), platinum (Pt), titanium (Ti) and aluminum (Al).

The wiring circuit layer 6 of the ceramic substrate 8 may be prepared similarly to the wiring circuit layers 4 and 5. However, the wiring circuit layer 6 needs not to be patterned correspondingly to the electrode surfaces of the IGBT 2 and the diode 3 as in the case of the wiring circuit layers 4 and 5. Hence, the wiring circuit layer 6 may be formed on the substantially entire surface of the ceramic substrate 8 by the film formation process. The wiring circuit layer 6 may also be formed by separately preparing a metal foil as the wiring circuit layer 6, and then bonding the metal foil on the entire surface of the ceramic substrate 8 by room-temperature bonding.

Figure 6C:
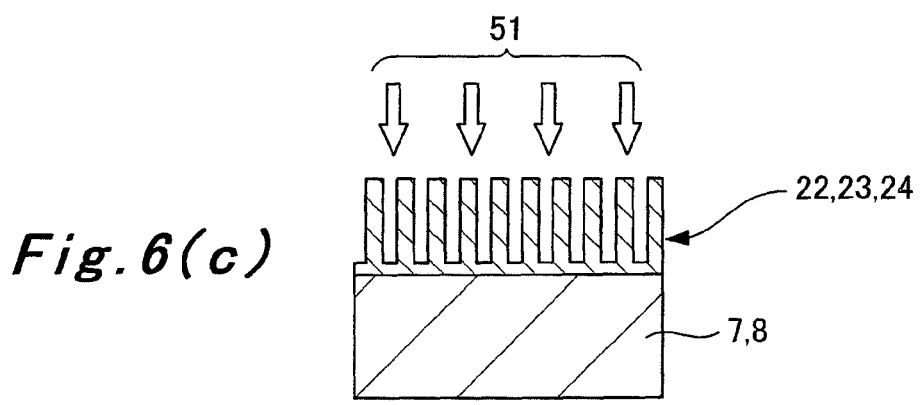
Figure 6D:
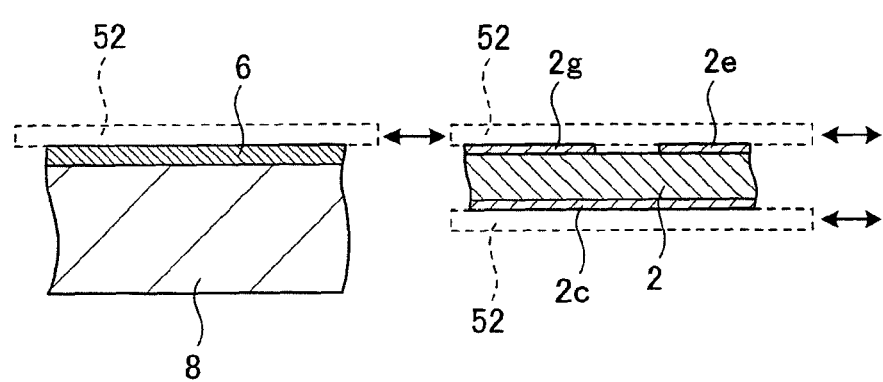

Note that in formation of the wiring circuit layers 22, 23 and 24 or the wiring circuit layers 31 illustrated in Embodiment 2, multiple vertical grooves each having a high aspect ratio in the thickness direction may be formed in the planar wiring circuit layers formed on the ceramic substrates 7 and 8. In this way, the wiring circuit layers 22, 23 and 24 or the wiring circuit layers 31 having the structure with the multiple fine columnar electrodes are formed. For example, in the processing of the wiring circuit layers 4a, 5a and 9a, multiple high-aspect-ratio fine vertical grooves may be formed in the planar wiring circuit layers having thicknesses of 10 to 100 μm, by using a microfabrication technique such as etching with laser or electron beams 51 as shown in FIG. 6(c), or imprinting through mold pressing. In this way, the wiring circuit layers 4a, 5a and 9a having the structure with multiple fine columnar electrodes are formed.

Meanwhile, when metal foils are used as in the cases of the wiring circuit layers 4b, 5b and 9b, multiple high-aspect-ratio fine vertical grooves may be formed in the metal foils in advance, and the metal foils may be then bonded to the ceramic substrates 7 and 8 by room-temperature bonding. In this way, the wiring circuit layers 4b, 5b and 9b having the structure with multiple fine columnar electrodes are formed. Further, the structure with multiple fine columnar electrodes can be formed through extrusion or metal film growth in specific regions. In addition, the structure with multiple fine columnar electrodes may be formed through lamination by room-temperature bonding.

Note that the wiring circuit layers 22, 23 and 24 or the wiring circuit layers 31 having the columnar electrode structure are each formed desirably in a deformable, and more desirably, elastically deformable shape and size as appropriate based on the usage environment (e.g., operation temperature, electrode material and the like). In addition, the aspect ratio of the columnar electrode structure is desirably 5:1 or greater, and more desirably 10:1 or greater.

Use of the wiring circuit layers 22, 23 and 24 or the wiring circuit layers 31 having the columnar electrode structure makes it possible to relax stresses due to heat generation and also to reliably secure electric connection and thermal connection of the wiring circuit layers 22, 23 and 24 or the wiring circuit layers 31.

In the bonding, by room-temperature bonding, of the so-prepared IGBT 2, diode 3, ceramic substrate 7, ceramic substrate 8 and sealing member 11, their bonding surfaces are polished and planarized for more reliable and stronger bonding than otherwise. Specifically, a CMP (Chemical Mechanical Polish) apparatus 52, for example, is used to polish and planarize: element surfaces including the collector electrode surface 2c, the emitter electrode surface 2e and the gate electrode surface 2g for the IGBT 2; element surfaces including the electrode surface 3c and the electrode surface 3e for the diode 3; surfaces of the wiring circuit layers 4 and 5 for the ceramic substrate 7; surfaces of the wiring circuit layer 6 for the ceramic substrate 8; and the like (see FIG. 6(d)). The polishing and planarization are performed by a chemical mechanical process such as CMP or a mechanical grinding process with a back grinder or the like. Note that the bond strength by room-temperature bonding is influenced by the surface roughness of the bonding surfaces. Thus, it is desirable to planarize the surfaces as smooth as possible preferably by CMP or the like. In this way, voids are prevented from being present at the bonding interfaces, which in turn makes it possible to achieve higher bond strength than otherwise.

(2) Bonding of Members

The following steps are performed to bond together the prepared IGBT 2, diode 3, ceramic substrate 7, ceramic substrate 8 and sealing member 11 whose bonding surfaces have been polished and planarized.

(2I) Bonding of IGBT 2 and Diode 3 to Ceramic Substrate 8

The prepared IGBT 2, diode 3 and ceramic substrate 8 whose bonding surfaces have been polished and planarized are bonded together as follows. With these members being placed inside a vacuum chamber of treatment equipment used to perform room-temperature bonding, an activation treatment to clean and activate the bonding surfaces of these members is first performed through physical sputtering with argon ion beams 53 or the like or through the like as shown in FIG. 7(a).

Specifically, under high vacuum, inactive layers formed in the bonding surfaces (e.g., impurities adhering to the surfaces, conversion products of the materials, the materials' outermost surface layers poor in reaction activity due to their bonds being terminated by oxygen or the like) are removed by physical sputtering or the like. Thereby, the bonding surfaces are cleaned and also put into a state where dangling bonds are present in the bonding surface, i.e., an activated state where active surfaces are exposed from the bonding surfaces. As the means for the physical sputtering, used are ion beams of inert atoms (e.g., argon or the like), fast atom beams (FAB), plasma, or the like. Incidentally, the activation treatment may be performed by disposing in advance the IGBT 2, the diode 3 and the ceramic substrate 8 in such locations that the IGBT 2 and the diode 3 face the ceramic substrate 8, and then by performing the physical sputtering simultaneously on their surfaces.

Then, the activated bonding surfaces are set to face each other, followed by adjustment of the positions thereof. Thereafter, the bonding surfaces are brought into contact with each other and pressure-welded to each other while applying loads F thereto, as shown in Step S1 in FIG. 5 and FIG. 7(b). Since dangling bonds are formed in the bonding surfaces by the surface activation, the pressure-welding causes the dangling bonds to form bonding. Consequently, the electrode surface 2c of the IGBT 2 and the electrode surface 3c of the diode 3 are strongly bonded to the wiring circuit layer 6 of the ceramic substrate 8 by room-temperature bonding, so that electric continuity and thermal continuity are established. In the room-temperature bonding performed in such manner, the bonding takes place between the dangling bonds of each bonding surface and those of the corresponding bonding surface. Thereby, high bond strength can be achieved. In addition, since the bonding is performed at room temperature, no thermal strain is caused.

(2II) Bonding of Sealing Member 11 to Ceramic Substrate 8

Next, the ceramic substrate 8, to which the IGBT 2 and the diode 3 have been bonded, and the sealing member 11 are bonded to each other as follows. Like (2I) described above, in a vacuum chamber, an activation treatment is performed on the bonding surfaces of these members. Then, the activated bonding surfaces are set to face each other, followed by adjustment of their positions. Thereafter, the bonding surfaces are brought into contact with each other and pressure-welded to each other while applying a load thereto (Step 2 in FIG. 5 and FIG. 8 (a)). Accordingly, the ceramic substrate 8 and the sealing member 11 are strongly bonded to each other by room-temperature bonding. In this event, the through-wiring 12 provided to the sealing member 11 is also strongly bonded to the wiring circuit layer 6 of the ceramic substrate 8, so that electric continuity and thermal continuity are established. Being bonded to the ceramic substrate 7 to be described later, the sealing member 11 seals the inside of the module, functioning to seal and also protect the IGBT 2 and the diode 3. Note that on an outer edge portion of the ceramic substrate 8, there may be formed in advance an outer peripheral wall which functions to seal the inside of the module like the sealing member 11 does. The IGBT 2 and the diode 3 maybe bonded to regions inward of the outer peripheral wall.

(2III) Bonding of IGBT 2, Diode 3 and Sealing Member 11 to Ceramic Substrate 7

Lastly, the IGBT 2, the diode 3 and the sealing member 11 having been bonded to the ceramic substrate 8 are bonded to the ceramic substrate 7 as follows. Like (2I) described above, in a vacuum chamber, an activation treatment is performed on the bonding surfaces of these members. Then, the activated bonding surfaces are set to face each other, followed by adjustment of their positions. Thereafter, the bonding surfaces are brought into contact with each other and pressure-welded to each other while applying a load thereto (Step 3 in FIG. 5 and FIG. 8(b)). Accordingly, the ceramic substrate 7 and the sealing member 11 (or the outer peripheral wall) are strongly bonded to each other by room-temperature bonding. Moreover, the emitter electrode surface 2e and the gate electrode surface 2g of the IGBT 2 and the electrode surface 3e of the diode 3 are strongly bonded to the wiring circuit layers 4 and 5 of the ceramic substrate 7 which are patterned correspondingly to these electrode surfaces. Thereby, electric continuity and thermal continuity are established.

In a case of vacuum-sealing the inside of the module, the inside of the module is vacuum-sealed naturally in the course of events after the bonding in (2III) described above, because the bonding of the sealing member 11 by room-temperature bonding is performed under vacuum atmosphere and thus the sealing member 11 (or the outer peripheral wall) itself functions as an air sealer. Meanwhile, in a case of sealing the inside of the module with resin, predetermined inlet holes are provided to the ceramic substrates 7 and 8 in advance. Then, after the bonding, flowable insulating resin is injected or vacuum-suctioned to be introduced from the inlet holes into spaces inside the module, whereby the inside of the module is sealed with the resin.

By the above manufacturing steps, the IGBT 2 and the diode 3 are mounted to the inside between the ceramic substrates 7 and 8, and the semiconductor element module 1 or 21 according to the present invention is manufactured.

In this embodiment, the manufacturing steps have been described as one example which is performed in the sequence as mentioned above, i.e., starting at (2I) for bonding the IGBT 2 and the diode 3 to the ceramic substrate 8 (the bonding and mounting of a collector electrode and the like), followed by (2II) for bonding the sealing member 11 to the ceramic substrate 8 (the formation of a sealing portion) and then (2III) for bonding the IGBT 2, the diode 3 and the sealing member 11 to the ceramic substrate 7 (the bonding and mounting of an emitter electrode, a gate electrode and the like). Note, however, that the present invention does not always need to follow this sequence. For example, the sequence may be such that (2I) and (2III) are switched. Likewise, after the module is formed, the radiation fin 41 may also be bonded to the ceramic substrate 8 by room-temperature bonding as shown in FIG. 4.

As described above, with the method for manufacturing the semiconductor element module according to the present invention, the wiring process and the mounting process are completed only by bonding the planar electrode surfaces of the IGBT 2 and the diode 3 to the planar circuit wiring layers 4, 5 and 6 (or the wiring circuit layers 22, 23 and 24) of the ceramic substrates 7 and 8 in a planar manner. Thus, as compared to conventional cases, the manufacturing processes of the module can be simplified significantly and also the number of components required can be reduced. This allows a significant reduction in process cost.

Note that examples of the arrangement of electrode surfaces of semiconductor elements such as the IGBT 2 and the diode 3 include configurations as shown in FIGS. 9(a) to 9(d) (in FIG. 9, description is given by taking the IGBT 2 as an example). Specifically, all the electrode surfaces (the emitter electrode surface 2e, the gate electrode surface 2g and the collector electrode surface 2c) may be disposed over the entire surface of the IGBT 2 on one side in such a way that each electrode surface has as large area as possible (see FIG. 9(a)). On a surface of the IGBT 2 on one side as above, each of the electrode surfaces (the emitter electrode surface 2e, the gate electrode surface 2g and the collector electrode surface 2c) may also be disposed in plurality (see FIG. 9(b)). On a surface of the IGBT 2 on one side as above, each of the electrode surfaces (the emitter electrode surface 2e, the gate electrode surface 2g and the collector electrode surface 2c) may be disposed in such a way as to occupy part of the whole area of the surface of the IGBT 2 (see FIG. 9(c)). Also, the electrode surfaces with the same patterns as any of the above arrangement examples may be formed on both surfaces of the IGBT 2. Furthermore, some of the electrode surfaces (the emitter electrode surface 2e and the gate electrode surface 2g) maybe disposed in plurality on a surface of the IGBT 2 on one side while disposing the remaining electrode surface (the collector electrode surface 2c) in plurality on a surface of the IGBT 2 on the other side (see FIG. 9(d)). In these cases, wiring surfaces corresponding to the patterns of the electrodes of the semiconductor element may be formed on the ceramic substrate(s) or only through-electrodes may be formed penetrating through the ceramic substrate in a location corresponding to the electrode surfaces.

Industrial Applicability

The present invention is suitable for a semiconductor element module in which multiple semiconductor elements such as power transistors large in output and amount of heat generation are integrated in one package, and also for a method for manufacturing the module. Such semiconductor element module is also applicable to motor modules for electric automobiles and the like.

The invention claimed is:

1. A semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed, wherein
the semiconductor element includes a plurality of electrode surfaces formed on part of a surface of the semiconductor element on one side,
the first insulating substrate includes a plurality of first wiring surfaces formed on a surface of the first insulating substrate on one side in such a way as to correspond to each electrode surfaces of the semiconductor element, and
the semiconductor element is mounted to the first insulating substrate and the second insulating substrate by bonding the surface of the semiconductor element on the one side to the first insulating substrate by use of room-temperature bonding in such a way that the electrode surfaces of the semiconductor element are caused to face the first wiring surfaces, and bonding a surface of the semiconductor element on the other side to the second insulating substrate by room-temperature bonding.

2. The semiconductor element module according to claim 1, wherein
at least one of the first insulating substrate and the second insulating substrate includes a connection wiring which is connected to a corresponding one of the first wiring surface and the second wiring surface and which is connectable to an outside, and
the connection wiring is formed to penetrate through the at least one of the first insulating substrate and the second insulating substrate in a thickness direction thereof.

3. The semiconductor element module according to claim 1, wherein
at least one of the first insulating substrate and the second insulating substrate includes a connection wiring which is connected to a corresponding one of the first wiring surface and the second wiring surface and which is connectable to an outside, and
the connection wiring is any one of:
one which is formed in such a way as to be drawn out from a surface of the any one of the first insulating substrate and the second insulating substrate in a lateral direction and also to penetrate through the outer peripheral portion between the first insulating substrate and the second insulating substrate in the lateral direction; and
one which is formed in a groove formed in such a way as to be drawn out from a surface of the any one of the first insulating substrate and the second insulating substrate in the lateral direction and also to penetrate through the at least one of the first insulating substrate and the second insulating substrate in the lateral direction.

4. The semiconductor element module according to claim 1, wherein at least one of the electrode surfaces, the first wiring surface and the second wiring surface is formed to have a planar surface.

5. The semiconductor element module according to claim 1, wherein at least one of the electrode surfaces, the first wiring surface and the second wiring surface is made of metal.

6. A semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed, wherein
the semiconductor element includes a plurality of electrode surfaces formed on part of surfaces of the semiconductor element on both sides,
the first insulating substrate includes a first wiring surface formed on a surface of the first insulating substrate on one side in such a way as to correspond to the electrode surfaces of the semiconductor element on one side,
the second insulating substrate includes a second wiring surface formed on a surface of the second insulating substrate on one side in such a way as to correspond to the electrode surfaces of the semiconductor element on the other side, and
the semiconductor element is mounted to the first insulating substrate and the second insulating substrate by bonding the surface of the semiconductor element on the one side to the first insulating substrate by use of room-temperature bonding in such a way that the electrode surfaces of the semiconductor element on the one side are caused to face the first wiring surface, and bonding the surface of the semiconductor element on the other side to the second insulating substrate by room-temperature bonding in such a way that the electrode surfaces of the semiconductor element on the other side are caused to face the second wiring surface.

7. The semiconductor element module according to claim 6, wherein
at least one of the first insulating substrate and the second insulating substrate includes a connection wiring which is connected to a corresponding one of the first wiring surface and the second wiring surface and which is connectable to an outside, and
the connection wiring is formed to penetrate through the at least one of the first insulating substrate and the second insulating substrate in a thickness direction thereof.

8. The semiconductor element module according to claim 6, wherein
at least one of the first insulating substrate and the second insulating substrate includes a connection wiring which is connected to a corresponding one of the first wiring surface and the second wiring surface and which is connectable to an outside, and
the connection wiring is any one of:
one which is formed in such a way as to be drawn out from a surface of the any one of the first insulating substrate and the second insulating substrate in a lateral direction and also to penetrate through the outer peripheral portion between the first insulating substrate and the second insulating substrate in the lateral direction; and
one which is formed in a groove formed in such a way as to be drawn out from a surface of the any one of the first insulating substrate and the second insulating substrate in the lateral direction and also to penetrate through the at least one of the first insulating substrate and the second insulating substrate in the lateral direction.

9. The semiconductor element module according to claim 6, wherein at least one of the electrode surfaces, the first wiring surface and the second wiring surface is formed to have a planar surface.

10. The semiconductor element module according to claim 6, wherein at least one of the electrode surfaces, the first wiring surface and the second wiring surface is made of metal.

11. A semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed, wherein
the semiconductor element includes a plurality of electrode surfaces formed over an entire surface of the semiconductor element on one side,
the first insulating substrate includes a plurality of first wiring surfaces formed on a surface of the first insulating substrate on one side in such a way as to correspond to each electrode surfaces of the semiconductor element, and
the semiconductor element is mounted to the first insulating substrate and the second insulating substrate by bonding the electrode surfaces of the semiconductor element to the first wiring surfaces by use of room-temperature bonding, and bonding a surface of the semiconductor element on the other side to the second insulating substrate by use of room-temperature bonding.

12. The semiconductor element module according to claim 11, wherein
a plurality of deformable and fine columnar electrodes are provided to surfaces of either the first and second wiring surfaces or the electrode surfaces of the semiconductor element, or both and
at least one of the first wiring surface and the second wiring surface is bonded to the electrode surfaces of the semiconductor element with the plurality of columnar electrodes therebetween, by use of room-temperature bonding.

13. The semiconductor element module according to claim 12, wherein shoulders at edges of bonding portions of the columnar electrodes are rounded, the shoulders being located on either sides closer to the first and second wiring surfaces or sides closer to the electrode surfaces of the semiconductor element, or both.

14. The semiconductor element module according to claim 12, wherein cooling means for cooling the semiconductor element module is provided to an outer surface of at least one of the first insulating substrate and the second insulating substrate by use of room-temperature bonding, in a case where both the first insulating substrate and the second insulating substrate or either the first insulating substrate or the second insulating substrate has no wiring penetrating therethrough in the thickness direction thereof.

15. The semiconductor element module according to claim 11, wherein
at least one of the first insulating substrate and the second insulating substrate includes a connection wiring which is connected to a corresponding one of the first wiring surface and the second wiring surface and which is connectable to an outside, and
the connection wiring is formed to penetrate through the at least one of the first insulating substrate and the second insulating substrate in a thickness direction thereof.

16. The semiconductor element module according to claim 11, wherein
at least one of the first insulating substrate and the second insulating substrate includes a connection wiring which is connected to a corresponding one of the first wiring surface and the second wiring surface and which is connectable to an outside, and
the connection wiring is any one of:
one which is formed in such a way as to be drawn out from a surface of the any one of the first insulating substrate and the second insulating substrate in a lateral direction and also to penetrate through the outer peripheral portion between the first insulating substrate and the second insulating substrate in the lateral direction; and
one which is formed in a groove formed in such a way as to be drawn out from a surface of the any one of the first insulating substrate and the second insulating substrate in the lateral direction and also to penetrate through the at least one of the first insulating substrate and the second insulating substrate in the lateral direction.

17. The semiconductor element module according to claim 11, wherein at least one of the electrode surfaces, the first wiring surface and the second wiring surface is formed to have a planar surface.

18. The semiconductor element module according to claim 11, wherein at least one of the electrode surfaces, the first wiring surface and the second wiring surface is made of metal.

19. A semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed, wherein
the semiconductor element includes a plurality of electrode surfaces formed over entire surfaces of the semiconductor element on both sides,
the first insulating substrate includes a first wiring surface formed on a surface of the first insulating substrate on one side in such a way as to correspond to the electrode surfaces of the semiconductor element on one side,
the second insulating substrate includes a second wiring surface formed on a surface of the second insulating substrate on one side in such a way as to correspond to the electrode surfaces of the semiconductor element on the other side, and
the semiconductor element is mounted to the first insulating substrate and the second insulating substrate by bonding the electrode surfaces of the semiconductor element on the one side to the first wiring surface by use of room-temperature bonding, and bonding the electrode surfaces of the semiconductor element on the other side to the second wiring surface by room-temperature bonding.

20. The semiconductor element module according to claim 19, wherein
at least one of the first insulating substrate and the second insulating substrate includes a connection wiring which is connected to a corresponding one of the first wiring surface and the second wiring surface and which is connectable to an outside, and
the connection wiring is formed to penetrate through the at least one of the first insulating substrate and the second insulating substrate in a thickness direction thereof.

21. The semiconductor element module according to claim 19, wherein
at least one of the first insulating substrate and the second insulating substrate includes a connection wiring which is connected to a corresponding one of the first wiring surface and the second wiring surface and which is connectable to an outside, and the connection wiring is any one of:
- one which is formed in such a way as to be drawn out from a surface of the any one of the first insulating substrate and the second insulating substrate in a lateral direction and also to penetrate through the outer peripheral portion between the first insulating substrate and the second insulating substrate in the lateral direction; and
- one which is formed in a groove formed in such a way as to be drawn out from a surface of the any one of the first insulating substrate and the second insulating substrate in the lateral direction and also to penetrate through the at least one of the first insulating substrate and the second insulating substrate in the lateral direction.

22. The semiconductor element module according to claim 19, wherein at least one of the electrode surfaces, the first wiring surface and the second wiring surface is formed to have a planar surface.

23. The semiconductor element module according to claim 19, wherein at least one of the electrode surfaces, the first wiring surface and the second wiring surface is made of metal.

24. The semiconductor element module according to claim 19, wherein
a plurality of deformable and fine columnar electrodes are provided to surfaces of either the first and second wiring surfaces or the electrode surfaces of the semiconductor element, or both and
at least one of the first wiring surface and the second wiring surface is bonded to the electrode surfaces of the semiconductor element with the plurality of columnar electrodes therebetween, by use of room-temperature bonding.

25. A semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed with an sealing member, wherein
the semiconductor element includes metallic and planar electrode surfaces formed on entire or substantially entire surfaces of the semiconductor element on both sides,
the first insulating substrate includes a metallic and planar first wiring surface formed on a surface of the first insulating substrate on one side in such a way as to correspond to the electrode surfaces of the semiconductor element on one side,
the sealing member includes a metallic first through-wiring connected to the first wiring surface and provided to penetrate through the sealing member,
the second insulating substrate includes
a metallic and planar second wiring surface formed on a surface of the second insulating substrate on one side in such a way as to correspond to the electrode surfaces of the semiconductor element on the other side,
a metallic second through-wiring connected to the second wiring surface and provided to penetrate through the second insulating substrate, and
a metallic third through-wiring connected to the first through-wiring and provided to penetrate through the second insulating substrate, and the semiconductor element is mounted to the first insulating substrate and the second insulating substrate by bonding the first insulating substrate to the sealing member by use of room-temperature bonding to thereby bond the first wiring surface to the first through-wiring, and bonding the electrode surfaces of the semiconductor element to the first wiring surface and the second wiring surface by use of room-temperature bonding.

26. The semiconductor element module according to claim 25, wherein
a plurality of deformable and fine columnar electrodes are provided to surfaces of either the first and second wiring surfaces or the electrode surfaces of the semiconductor element, or both and
at least one of the first wiring surface and the second wiring surface is bonded to the electrode surfaces of the semiconductor element with the plurality of columnar electrodes therebetween, by use of room-temperature bonding.

27. A method for manufacturing a semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed, the method comprising:
forming a plurality of electrode surfaces on part of a surface of the semiconductor element on one side,
forming a plurality of first wiring surfaces on a surface of the first insulating substrate on one side in such a way that the first wiring surfaces corresponds to each electrode surfaces of the semiconductor element, and
mounting the semiconductor element to the first insulating substrate and the second insulating substrate by bonding the surface of the semiconductor element on the one side to the first insulating substrate by use of room-temperature bonding in such a way that the electrode surfaces of the semiconductor element are caused to face the first wiring surfaces, and bonding a surface of the semiconductor element on the other side to the second insulating substrate by room-temperature bonding.

28. The method for manufacturing the semiconductor element module according to claim 27, wherein a connection wiring is formed in at least one of the first insulating substrate and the second insulating substrate in such a way as to be connected to a corresponding one of the first wiring surface and the second wiring surface and to penetrate through the at least one of the first insulating substrate and the second insulating substrate in a thickness direction thereof so that the connection wiring is connectable to an outside.

29. The method for manufacturing the semiconductor element module according to claim 27, wherein
a connection wiring which is connected to any one of the first wiring surface and the second wiring surface and which is connectable to an outside is formed by:
forming a wiring in such a way that the wiring is drawn out from a surface of the any one of the first insulating substrate and the second insulating substrate in a lateral direction and penetrates through the outer peripheral portion between the first insulating substrate and the second insulating substrate in the lateral direction; or
forming a groove and a wiring in the groove in such a way that the groove and the wiring are drawn out from a surface of the any one of the first insulating substrate and the second insulating substrate in the lateral direction and penetrates through the at least one of the first insulating substrate and the second insulating substrate in the lateral direction.

30. The method for manufacturing the semiconductor element module according to claim 27, wherein at least one of the electrode surfaces, the first wiring surface and the second wiring surface is formed to have a planar surface.

31. The method for manufacturing the semiconductor element module according to claim 27, wherein at least one of the electrode surfaces, the first wiring surface and the second wiring surface is made of metal.

32. A method for manufacturing a semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed, the method comprising:
forming a plurality of electrode surfaces on part of surfaces of the semiconductor element on both sides;
forming a first wiring surface on a surface of the first insulating substrate on one side in such a way that the first wiring surface corresponds to the electrode surfaces of the semiconductor element on one side;
forming a second wiring surface on a surface of the second insulating substrate on one side in such a way that the second wiring surface corresponds to the electrode surfaces of the semiconductor element on the other side; and
the semiconductor element is mounted to the first insulating substrate and the second insulating substrate by bonding the surface of the semiconductor element on the one side to the first insulating substrate by use of room-temperature bonding in such a way that the electrode surfaces of the semiconductor element on the one side are caused to face the first wiring surface, and bonding the surface of the semiconductor element on the other side to the second insulating substrate by room-temperature bonding in such a way that the electrode surfaces of the semiconductor element on the other side are caused to face the second wiring surface.

33. The method for manufacturing the semiconductor element module according to claim 32, wherein a connection wiring is formed in at least one of the first insulating substrate and the second insulating substrate in such a way as to be connected to a corresponding one of the first wiring surface and the second wiring surface and to penetrate through the at least one of the first insulating substrate and the second insulating substrate in a thickness direction thereof so that the connection wiring is connectable to an outside.

34. The method for manufacturing the semiconductor element module according to claim 32, wherein
a connection wiring which is connected to any one of the first wiring surface and the second wiring surface and which is connectable to an outside is formed by:
forming a wiring in such a way that the wiring is drawn out from a surface of the any one of the first insulating substrate and the second insulating substrate in a lateral direction and penetrates through the outer peripheral portion between the first insulating substrate and the second insulating substrate in the lateral direction; or
forming a groove and a wiring in the groove in such a way that the groove and the wiring are drawn out from a surface of the any one of the first insulating substrate and the second insulating substrate in the lateral direction and penetrates through the at least one of the first insulating substrate and the second insulating substrate in the lateral direction.

35. The method for manufacturing the semiconductor element module according to claim 32, wherein at least one of the electrode surfaces, the first wiring surface and the second wiring surface is formed to have a planar surface.

36. The method for manufacturing the semiconductor element module according to claim 32, wherein at least one of the electrode surfaces, the first wiring surface and the second wiring surface is made of metal.

37. A method for manufacturing a semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed, the method comprising:
forming a plurality of electrode surfaces over an entire surface of the semiconductor element on one side;
forming a plurality of first wiring surfaces on a surface of the first insulating substrate on one side in such a way that the first wiring surfaces corresponds to each electrode surfaces of the semiconductor element on the one side; and
mounting the semiconductor element to the first insulating substrate and the second insulating substrate by bonding the electrode surfaces of the semiconductor element to the first wiring surfaces by use of room-temperature bonding, and bonding a surface of the semiconductor element on the other side to the second insulating substrate by use of room-temperature bonding.

38. The method for manufacturing the semiconductor element module according to claim 37, wherein
a plurality of deformable and fine columnar electrodes are formed in surfaces of either the first and second wiring surfaces or the electrode surfaces of the semiconductor element, or both, and
at least one of the first wiring surface and the second wiring surface is bonded to the electrode surfaces of the semiconductor element with the plurality of columnar electrodes therebetween, by use of room-temperature bonding.

39. The method for manufacturing the semiconductor element module according to claim 38, wherein shoulders at edges of bonding portions of the columnar electrodes are rounded, the shoulders being located on either sides closer to the first and second wiring surfaces or sides closer to the electrode surfaces of the semiconductor element, or both.

40. The method for manufacturing the semiconductor element module according to claim 38, wherein cooling means for cooling the semiconductor element module is bonded to an outer surface of at least one of the first insulating substrate and the second insulating substrate by use of room-temperature bonding, in a case where both the first insulating substrate and the second insulating substrate or either the first insulating substrate or the second insulating substrate has no wiring penetrating therethrough in the thickness direction thereof.

41. The method for manufacturing the semiconductor element module according to claim 37, wherein a connection wiring is formed in at least one of the first insulating substrate and the second insulating substrate in such a way as to be connected to a corresponding one of the first wiring surface and the second wiring surface and to penetrate through the at least one of the first insulating substrate and the second insulating substrate in a thickness direction thereof so that the connection wiring is connectable to an outside.

42. The method for manufacturing the semiconductor element module according to claim 37, wherein
a connection wiring which is connected to any one of the first wiring surface and the second wiring surface and which is connectable to an outside is formed by:
forming a wiring in such a way that the wiring is drawn out from a surface of the any one of the first insulating substrate and the second insulating substrate in a lateral direction and penetrates through the outer peripheral portion between the first insulating substrate and the second insulating substrate in the lateral direction; or
forming a groove and a wiring in the groove in such a way that the groove and the wiring are drawn out from a surface of the any one of the first insulating substrate and the second insulating substrate in the lateral direction and penetrates through the at least one of the first insulating substrate and the second insulating substrate in the lateral direction.

43. The method for manufacturing the semiconductor element module according to claim 37, wherein at least one of the electrode surfaces, the first wiring surface and the second wiring surface is formed to have a planar surface.

44. The method for manufacturing the semiconductor element module according to claim 37, wherein at least one of the electrode surfaces, the first wiring surface and the second wiring surface is made of metal.

45. A method for manufacturing a semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed, the method comprising:
forming a plurality of electrode surfaces over entire surfaces of the semiconductor element on both sides;
forming a first wiring surface on a surface of the first insulating substrate on one side in such a way that the first wiring surface corresponds to the electrode surfaces of the semiconductor element on one side;
forming a second wiring surface on a surface of the second insulating substrate on one side in such a way that the second wiring surface corresponds to the electrode surfaces of the semiconductor element on the other side; and
mounting the semiconductor element to the first insulating substrate and the second insulating substrate by bonding the electrode surfaces of the semiconductor element on the one side to the first wiring surface by use of room-temperature bonding, and bonding the electrode surfaces of the semiconductor element on the other side to the second wiring surface by room-temperature bonding.

46. The method for manufacturing the semiconductor element module according to claim 45, wherein a connection wiring is formed in at least one of the first insulating substrate and the second insulating substrate in such a way as to be connected to a corresponding one of the first wiring surface and the second wiring surface and to penetrate through the at least one of the first insulating substrate and the second insulating substrate in a thickness direction thereof so that the connection wiring is connectable to an outside.

47. The method for manufacturing the semiconductor element module according to claim 45, wherein
a connection wiring which is connected to any one of the first wiring surface and the second wiring surface and which is connectable to an outside is formed by:
forming a wiring in such a way that the wiring is drawn out from a surface of the any one of the first insulating substrate and the second insulating substrate in a lateral direction and penetrates through the outer peripheral portion between the first insulating substrate and the second insulating substrate in the lateral direction; or
forming a groove and a wiring in the groove in such a way that the groove and the wiring are drawn out from a surface of the any one of the first insulating substrate and the second insulating substrate in the lateral direction and penetrates through the at least one of the first insulating substrate and the second insulating substrate in the lateral direction.

48. The method for manufacturing the semiconductor element module according to claim 45, wherein at least one of the electrode surfaces, the first wiring surface and the second wiring surface is formed to have a planar surface.

49. The method for manufacturing the semiconductor element module according to claim 45, wherein at least one of the electrode surfaces, the first wiring surface and the second wiring surface is made of metal.

50. The method for manufacturing the semiconductor element module according to claim 45, wherein
a plurality of deformable and fine columnar electrodes are formed in surfaces of either the first and second wiring surfaces or the electrode surfaces of the semiconductor element, or both, and
at least one of the first wiring surface and the second wiring surface is bonded to the electrode surfaces of the semiconductor element with the plurality of columnar electrodes therebetween, by use of room-temperature bonding.

51. A method for manufacturing a semiconductor element module in which at least one semiconductor element is sandwiched between a first insulating substrate having a high thermal conductivity and a second insulating substrate having a high thermal conductivity, and an outer peripheral portion between the first insulating substrate and the second insulating substrate is sealed with a sealing member, the method comprising:
forming metallic and planar electrode surfaces in entire or substantially entire surfaces of the semiconductor element on both sides;
forming a metallic and planar first wiring surface on a surface of the first insulating substrate on one side in such a way that the first wiring surface corresponds to the electrode surfaces of the semiconductor element on one side;
forming a metallic first through-wiring penetrating through the sealing member and connected to the first wiring surface is formed;
forming a metallic and planar second wiring surface on a surface of the second insulating substrate on one side in such a way that the second wiring surface corresponds to the electrode surfaces of the semiconductor element on the other side;
forming a metallic second through-wiring penetrating through the second insulating substrate and connected to the second wiring surface;
forming a metallic third through-wiring penetrating through the second insulating substrate and connected to the first through-wiring; and
mounting the semiconductor element to the first insulating substrate and the second insulating substrate by bonding the first insulating substrate to the sealing member by use of room-temperature bonding to thereby bond the first wiring surface to the first through-wiring, and bonding the electrode surfaces of the semiconductor element to the first wiring surface and the second wiring surface by use of room-temperature bonding.

52. The method for manufacturing the semiconductor element module according to claim 51, wherein a plurality of deformable and fine columnar electrodes are formed in surfaces of either the first and second wiring surfaces or the electrode surfaces of the semiconductor element, or both, and at least one of the first wiring surface and the second wiring surface is bonded to the electrode surfaces of the semiconductor element with the plurality of columnar electrodes therebetween, by use of room-temperature bonding.

* * * * *

UNITED STATES PATENT AND TRADEMARK OFFICE
CERTIFICATE OF CORRECTION

PATENT NO. : 8,222,724 B2
APPLICATION NO. : 12/866322
DATED : July 17, 2012
INVENTOR(S) : Daishi Ueno et al.

It is certified that error appears in the above-identified patent and that said Letters Patent is hereby corrected as shown below:

On the Cover Page

In Section (75) Inventors, lines 6-7, please change "Kenj Fujiwara" to --Kenji Fujiwara--.

Signed and Sealed this
Ninth Day of October, 2012

David J. Kappos
*Director of the United States Patent and Trademark Office*